United States Patent
Hirose et al.

(10) Patent No.: US 9,815,742 B2
(45) Date of Patent: Nov. 14, 2017

(54) OXIDE CERAMIC AND CERAMIC ELECTRONIC COMPONENT

(71) Applicant: Murata Manufacturing Co., Ltd., Nagaokakyo-shi, Kyoto-fu (JP)

(72) Inventors: Sakyo Hirose, Nagaokakyo (JP); Tsuyoshi Kimura, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 197 days.

(21) Appl. No.: 14/682,267

(22) Filed: Apr. 9, 2015

(65) Prior Publication Data

US 2015/0210597 A1 Jul. 30, 2015

Related U.S. Application Data

(63) Continuation of application No. PCT/JP2013/077998, filed on Oct. 15, 2013.

(30) Foreign Application Priority Data

Oct. 18, 2012 (JP) ................................. 2012-230670

(51) Int. Cl.
| | |
|---|---|
| C04B 35/26 | (2006.01) |
| H01F 1/01 | (2006.01) |
| H01F 29/00 | (2006.01) |
| H01F 27/28 | (2006.01) |
| H01F 27/29 | (2006.01) |
| H01F 27/24 | (2006.01) |
| G01R 33/02 | (2006.01) |
| G01R 15/18 | (2006.01) |
| H01B 3/12 | (2006.01) |
| H01F 1/34 | (2006.01) |
| H01F 17/00 | (2006.01) |
| H01F 17/04 | (2006.01) |
| H01F 21/02 | (2006.01) |
| B32B 18/00 | (2006.01) |
| C04B 35/626 | (2006.01) |
| C04B 35/638 | (2006.01) |

(52) U.S. Cl.
CPC ............ *C04B 35/265* (2013.01); *B32B 18/00* (2013.01); *C04B 35/26* (2013.01); *C04B 35/2633* (2013.01); *C04B 35/6261* (2013.01); *C04B 35/62675* (2013.01); *C04B 35/638* (2013.01); *G01R 15/183* (2013.01); *G01R 33/02* (2013.01); *H01B 3/12* (2013.01); *H01F 1/01* (2013.01); *H01F 1/348* (2013.01); *H01F 17/0013* (2013.01); *H01F 17/04* (2013.01); *H01F 21/02* (2013.01); *H01F 27/24* (2013.01); *H01F 27/2804* (2013.01); *H01F 27/2823* (2013.01); *H01F 27/29* (2013.01); *H01F 29/00* (2013.01); *C04B 2235/3206* (2013.01); *C04B 2235/3208* (2013.01); *C04B 2235/3213* (2013.01); *C04B 2235/3215* (2013.01); *C04B 2235/3244* (2013.01); *C04B 2235/3277* (2013.01); *C04B 2235/3279* (2013.01); *C04B 2235/3284* (2013.01); *C04B 2235/6025* (2013.01); *C04B 2235/663* (2013.01); *C04B 2235/767* (2013.01); *C04B 2237/34* (2013.01); *C04B 2237/68* (2013.01); *C04B 2237/704* (2013.01)

(58) Field of Classification Search
CPC ... C04B 35/265; C04B 35/26; C04B 35/2633; C04B 35/62675; C04B 35/638; H01F 1/01; H01F 1/348; H01F 17/0013; H01F 17/014

See application file for complete search history.

(56) References Cited

U.S. PATENT DOCUMENTS

| 4,032,674 A | * | 6/1977 | Hirabayashi | ............ H01F 10/20 252/62.55 |
|---|---|---|---|---|
| 6,248,253 B1 | * | 6/2001 | Taguchi | .............. C04B 35/2633 252/62.59 |
| 6,258,290 B1 | * | 7/2001 | Taguchi | .............. C04B 35/2641 252/62.57 |

FOREIGN PATENT DOCUMENTS

| JP | 2012-082083 A | 4/2012 |
|---|---|---|
| JP | 2012-001396 A | 1/2015 |
| WO | WO 2012/011464 A1 | 1/2012 |

OTHER PUBLICATIONS

International Search Report issued for PCT/JP2013/077998, dated Jan. 28, 2014.
Written Opinion of the International Searching Authority issued for PCT/JP2013/077998, dated Jan. 28, 2014.

* cited by examiner

*Primary Examiner* — Carol M Koslow
(74) *Attorney, Agent, or Firm* — Arent Fox LLP

(57) ABSTRACT

An oxide ceramic having a principal component formed of a ferrite compound containing at least Sr, Co, and Fe, and zirconium in an amount of 0.05 to 1.0 wt. % on an oxide equivalent basis, and a ceramic electronic component using the oxide ceramic.

30 Claims, 10 Drawing Sheets

OXIDE CERAMIC AND CERAMIC ELECTRONIC COMPONENT

CROSS REFERENCE TO RELATED APPLICATIONS

The present application is a continuation of International application No. PCT/JP2013/077998, filed Oct. 15, 2013, which claims priority to Japanese Patent Application No. 2012-230670, filed Oct. 18, 2012, the entire contents of each of which are incorporated herein by reference.

FIELD OF THE INVENTION

The present invention relates to an oxide ceramic and a ceramic electronic component, and more particularly to an oxide ceramic formed of a ferromagnetic dielectric material exhibiting an electromagnetic effect, and a ceramic electronic component, such as an inductor or a power generation element, using the oxide ceramic.

BACKGROUND OF THE INVENTION

In recent years, ferromagnetic dielectric (multiferroics) materials, in which a ferromagnetic property and a ferroelectricity coexist and exhibit a multiple action, receive attention and are actively researched and developed.

The ferromagnetic dielectric material is known to exert the following effect: when a magnetic field is applied, a magnetic order of a helical spin type is induced to develop ferroelectricity, and thereby electric polarization occurs, or electric polarization or the dielectric constant changes, and when an electric field is applied, magnetization occurs or magnetization changes, the so-called electromagnetic effect.

Since the ferromagnetic dielectric material can cause a change in magnetization by the electric field and a change in electric polarization by the magnetic field through the above-mentioned electromagnetic effect, various novel and useful ceramic electronic components which use both magnetization and electric polarization, such as inductors, actuators and power generation elements, are expected to be realized.

Patent Document 1 proposes an electromagnetic effect material which is made of an oxide ceramic represented by the general formula $(Sr_{1-\alpha}Ba_{\alpha})_3(Co_{1-\beta}B_{\beta})_2Fe_{24}O_{41+\delta}$ (wherein B represents one or more elements selected from the group consisting of Ni, Zn, Mn, Mg and Cu, and $\alpha$, $\beta$, and $\delta$ satisfy $0 \leq \alpha \leq 0.3$, $0 \leq \beta \leq 0.3$, and $-1 \leq \delta \leq 1$, respectively) as a principal component, and has an electromagnetic effect in a temperature range of 250 to 350 K and in a magnetic field range of 0.05 T (tesla) or less.

Patent Document 1 tries to obtain a ferromagnetic dielectric material which has good insulation performance and a desired electromagnetic effect even near room temperature and at a weak magnetic field of 0.05 T or less by using a ferromagnetic dielectric material having a hexagonal Z-type crystal structure represented by the above-mentioned general formula.

Patent Document 1: JP 2012-1396 A (claim 1, paragraph [0010], Tables 1 to 3, etc.)

SUMMARY OF THE INVENTION

However, since a $Sr_3Co_2Fe_{24}O_{41}$-based compound described in Patent Document 1 has a very complicated crystal structure of a hexagonal Z-type, the compound is hard to stably produce at high yield and has low freedom of design, and insulation performance may possibly be deteriorated or ferromagnetic dielectric properties may possibly be deteriorated depending on firing conditions (firing temperature, firing time, atmosphere of firing, etc.). That is, in Patent Document 1, it is difficult to industrially produce an oxide ceramic having desired ferromagnetic dielectric properties and insulation performance stably at high yield, and it is still difficult to put the oxide ceramic to practical use for various ceramic electronic components.

The present invention was made in view of such a situation, and it is an object of the present invention to provide an oxide ceramic capable of stably attaining better insulation performance and ferromagnetic dielectric properties, and a ceramic electronic component using the oxide ceramic.

The present inventors made earnest investigations concerning an oxide ceramic containing a $Sr_3Co_2Fe_{24}O_{41}$-based compound as a principal component, and consequently found that when zirconium is contained, in an oxide ceramic, in an amount of 0.05 to 1.0 wt. % on an oxide equivalent basis, an oxide ceramic having better insulation performance and ferromagnetic dielectric properties can be stably obtained.

Further, it was found that the $Sr_3Co_2Fe_{24}O_{41}$-based compound typically has a hexagonal Z-type crystal structure, but even a $Sr_3Co_2Fe_{24}O_{41}$-based compound of a crystal system lower in symmetry than the hexagonal crystal system can achieve a similar effect by containing the above-mentioned predetermined amount of zirconium as long as the compound is a ferrite compound containing at least Sr, Co, and Fe in the principal component.

The present invention was made based on these findings, and the oxide ceramic according to the present invention is characterized in that its principal component is formed of a ferrite compound containing at least Sr, Co, and Fe, and zirconium is contained in an amount of 0.05 to 1.0 wt. % on an oxide equivalent basis.

In the oxide ceramic of the present invention, the principal component preferably contains one or more elements selected from among Ba, Ca, Ni, Zn, and Mg.

Further, the present inventors further made earnest investigations concerning the $Sr_3Co_2Fe_{24}O_{41}$-based compound, and consequently found that it is possible to obtain an oxide ceramic which can be stably produced at high yield while ensuring insulation performance and ferromagnetic dielectric properties which are similarly good even if a part of Sr is replaced with Ba and/or Ca, a part of Co is replaced with Ni, Zn and/or Mg, or a part of Fe is lost as required within a predetermined range.

That is, in the oxide ceramic of the present invention, the principal component is preferably represented by the general formula $Sr_{3-x}A_xCo_{2-y}M_yFe_{24-z}O_{41}$, wherein A represents at least one element selected from among Ba and Ca, M represents at least one element selected from among Ni, Zn and Mg, x satisfies $0 \leq x \leq 0.5$ when the element A is Ba and satisfies $0 \leq x \leq 0.2$ when the element A is Ca, and y and z satisfy $0 \leq y \leq 0.3$ and $0 \leq z \leq 0.5$, respectively.

Further, by using the oxide ceramic, it becomes possible to realize various ceramic electronic components capable of stably attaining good insulation performance and ferromagnetic dielectric properties.

That is, the ceramic electronic component according to the present invention is a ceramic electronic component having a component base body and external electrodes formed on a surface of the component base body, wherein the component base body is formed of an oxide ceramic according to any one of the above-mentioned oxide ceramics, and a coil is disposed so as to have an inductance in accordance with the magnetic permeability of the component base body.

As such a ceramic electronic component, various preferred aspects as described below are possible.

That is, in the ceramic electronic component of the present invention, the component base body preferably includes an electrode for applying a voltage.

Moreover, in the ceramic electronic component of the present invention, it is preferred that the electrode for applying a voltage includes at least one internal electrode, and the internal electrode is electrically connected to the external electrode formed on the surface of the component base body.

Further, in the ceramic electronic component of the present invention, the coil is preferably wound around the component base body so as to suspend between one of the external electrodes and the other of the external electrodes.

Further, in the ceramic electronic component of the present invention, the coil is preferably wound around a perimeter of the component base body excluding the external electrodes.

Moreover, in the ceramic electronic component of the present invention, the coil is preferably embedded in the component base body.

Further, in the ceramic electronic component of the present invention, it is preferred that the coil has a coil conductor formed planarly, and is formed on at least one principal surface of the component base body.

Further, in the ceramic electronic component of the present invention, an insulating layer is preferably interposed between the coil and the component base body.

Further, in the ceramic electronic component of the present invention, a magnetic field application means for applying a fixed magnetic field is preferably disposed in the vicinity of at least one of the external electrodes formed on both ends.

Further, in the ceramic electronic component of the present invention, a magnetic field application means for applying a fixed magnetic field is preferably disposed in the vicinity of at least one principal surface of the component base body.

Further, in the ceramic electronic component of the present invention, the magnetic field application means is preferably a permanent magnet.

The ceramic electronic component including these components is applicable to various fields and particularly useful for variable inductors, power generation elements, magnetic sensors, current sensors and the like.

That is, the ceramic electronic component of the present invention is preferably a variable inductor whose inductance varies by application of an electric field.

Thereby, since the inductance can be varied only by applying the electric field, it becomes possible to realize a variable inductor which can be installed in various mobile telecommunication devices.

Further, the ceramic electronic component of the present invention is preferably a power generation element which generates electric power by application of a magnetic field.

Thereby, since it is possible to generate electric power by application of a magnetic field without involving deformation of the component base body, it becomes possible to realize a power generation element having improved durability.

Further, the ceramic electronic component of the present invention is preferably a magnetic sensor which outputs a current according to the magnitude of a magnetic field.

Thereby, it becomes possible to realize a compact and simple magnetic sensor.

Further, the ceramic electronic component of the present invention is preferably a current sensor which outputs a current according to the magnitude of a magnetic field formed by a current having flowed through the coil.

Thereby, it becomes possible to realize a compact current sensor since the ceramic electronic component of the present invention outputs a current according to the magnitude of a magnetic field formed by a current having flowed through the coil.

With the oxide ceramic of the present invention, it becomes possible to realize an oxide ceramic capable of stably attaining good insulation performance and ferromagnetic dielectric properties since the principal component of the oxide ceramic is formed of a ferrite compound containing at least Sr, Co and Fe, and zirconium is contained, in the oxide ceramic, in an amount of 0.05 to 1.0 wt. % on an oxide equivalent basis.

Further, with the ceramic electronic component of the present invention, since the ceramic electronic component has a component base body and external electrodes formed on a surface of the component base body, the component base body is formed of the above-mentioned oxide ceramic, and a coil is disposed so as to have an inductance in accordance with the magnetic permeability of the component base body, various ceramic electronic components using ferromagnetic dielectric properties, such as inductors and power generation elements, can be easily attained.

DETAILED DESCRIPTION OF THE INVENTION

Figure 1:
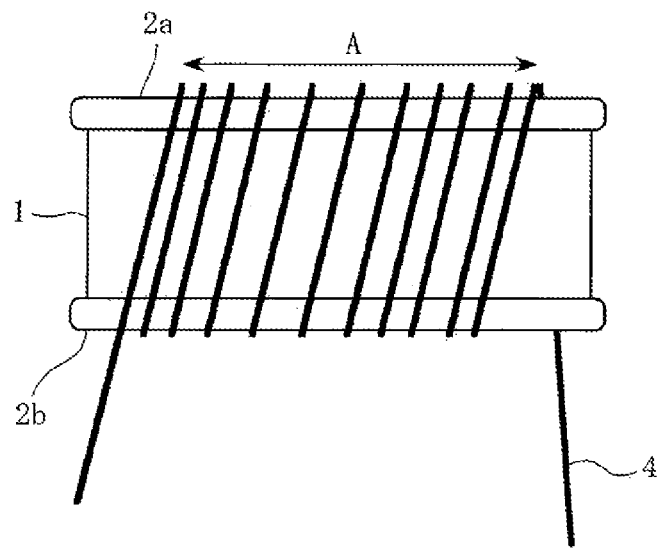
FIG. 1 is a front view showing an embodiment (first embodiment) of a ceramic electronic component formed by using an oxide ceramic of the present invention.

Next, embodiments of the present invention will be described in detail.

In an oxide ceramic as an embodiment of the present invention, the principal component of the oxide ceramic is formed of a ferrite compound containing at least Sr, Co, and Fe, and zirconium is contained in an amount of 0.05 to 1.0 wt. % on an oxide equivalent basis.

The present oxide ceramic specifically contains $Sr_3Co_2Fe_{24}O_{41}$ $((SrO)_3(CoO)_2(Fe_2O_3)_{12})$-based compound having a hexagonal Z-type crystal structure as a principal component, and a zirconium oxide typified by $ZrO_2$ is contained in an amount of 0.05 to 1.0 wt. %. This constitution makes it possible to obtain an oxide ceramic which has good insulation performance and ferromagnetic dielectric properties, and is suitable for industrial production due to its high yield and capability of stable production.

As described in detail in Non-Patent Document 1, the hexagonal Z-type crystal structure has a complicated crystal structure in which three different blocks of an R block, an S block and a T block are layered in the order of R-S-T-S-R*-S*-T*-S*. The symbol * indicates a block which is rotated by 180° with respect to the c-axis. For example, in the case of $Sr_3Co_2Fe_{24}O_{41}$, the definition of each block in chemical formula is as follows: the R block is composed of $[SrFe_6O_{11}]^{2-}$, the S block is composed of $Co_2^{2+}Fe_4O_8$, and the T block is composed of $Sr_2Fe_8O_{14}$. It is described that $Sr_3Co_2Fe_{24}O_{41}$ has a multi-layer structure having a lamination period in which the above-mentioned R, S and T blocks are layered in the order of R-S-T-S . . . .

Non-Patent Document 1: Robert C. Pullar, "Hexagonal Ferrites: A review of the synthesis, properties and applications of hexaferrite ceramics", Progress in Materials Science 57, 2012, pp. 1191-1334

As described in Patent Document 1, the $Sr_3Co_2Fe_{24}O_{41}$-based compound having the hexagonal Z-type crystal structure is regarded as a promising ferromagnetic dielectric material capable of achieving a ferromagnetic property and ferroelectricity simultaneously, and, based on the electromagnetic effect, it can cause electric polarization by application of a magnetic field and can be expected to cause a change in magnetization by application of the electric field.

Then, the present $Sr_3Co_2Fe_{24}O_{41}$-based compound is expected to be applied to various ceramic electronic components using both magnetization and electric polarization, such as inductors and power generation elements, since the compound has high electric polarization and good insulation performance at room temperature.

However, as described above, the $Sr_3Co_2Fe_{24}O_{41}$-based compound has a very complicated crystal structure of a hexagonal Z-type. Therefore, it is difficult to industrially produce the compound stably at high yield while ensuring desired properties.

Thus, in the present embodiment, by making the oxide ceramic contain zirconium in an amount of 0.05 to 1.0 wt. % on an oxide equivalent basis, an oxide ceramic is obtained, which has good insulation performance and ferromagnetic dielectric properties, and is suitable for industrial production due to its high yield and capability of stable production.

That is, this kind of oxide ceramic is usually synthesized by blending predetermined ceramic base materials, and firing the mixture as described later.

However, when the zirconium oxide is not contained in the oxide ceramic containing the $Sr_3Co_2Fe_{24}O_{41}$-based compound as a principal component, the sinterability is low, and there is a possibility that densification and grain growth of the oxide ceramic do not adequately proceed even under a higher firing temperature, and the oxide ceramic is melted without being sintered under an excessively high firing temperature.

In contrast, when zirconium is contained in the above-mentioned oxide ceramic in an amount of 0.05 to 1.0 wt. % on an oxide equivalent basis, the sinterability can be improved. That is, it is presumed that when the oxide ceramic contains the above-mentioned predetermined amount of zirconium, even if the firing temperature is not excessively increased, the zirconium solid-solves in the $Sr_3Co_2Fe_{24}O_{41}$-based compound as a principal component to be uniformly or substantially uniformly distributed in the crystal grains, and therefore the densification can be promoted and grain growth can be promoted to improve the sinterability. As a result, it becomes possible to attain an oxide ceramic which has good yield and stable insulation performance and ferromagnetic dielectric properties.

Here, the reason why the content of zirconium in the oxide ceramic is set to 0.05 to 1.0 wt. % on an oxide equivalent basis is as follows.

When the content of zirconium is less than 0.05 wt. % on an oxide equivalent basis, the oxide ceramic cannot adequately exert the effect caused by the contained zirconium, and thus the content of at least 0.05 wt. % is required.

On the other hand, when the content of zirconium is more than 1.0 wt. % on an oxide equivalent basis, there is a possibility that a heterogenous phase other than a Z-type crystal structure, for example, a U-type crystal structure such as $Sr_4Co_2Fe_{36}O_{60}$ $((SrO)_4(CoO)_2(Fe_2O_3)_{18})$ system and a W-type crystal structure such as $SrCo_2Fe_{16}O_{27}$ $((SrO)(CoO)_2(Fe_2O_3)_8)$ system, is precipitated, and the crystal structure has an inhomogeneous microstructure, resulting in the deterioration of the ferromagnetic dielectric properties and the insulation performance.

Accordingly, it is necessary that the content of zirconium is 0.05 to 1.0 wt. % on an oxide equivalent basis, as described above.

In addition, as described above, zirconium is mostly uniformly or substantially uniformly distributed in the crystal grains and present in the form of a zirconium-principal component solid solution. However, a part of principal component elements such as Sr, Co and Fe may be replaced with Zr, or a part of the zirconium oxide may be segregated at a grain boundary or a crystal triple point.

Further, the principal component of the present oxide ceramic may be a ferrite compound containing at least Sr, Co, and Fe, and for example, it is also preferred that the $Sr_3Co_2Fe_{24}O_{41}$-based compound contains one or more elements selected from among Ba, Ca, Ni, Zn and Mg as required.

Moreover, in the oxide ceramic, a part of Sr may be replaced with Ba or Ca at a predetermined rate, or a part of Co may be replaced with Ni, Zn or Mg, or a part of Fe may be lost within a predetermined range.

In this case, the principal component can be represented by the general formula (A):

$$Sr_{3-x}A_xCo_{2-y}M_yFe_{24-z}O_{41} \quad (A)$$

A represents at least one element selected from among Ba and Ca, and M represents at least one element selected from among Ni, Zn and Mg.

In the above-mentioned formula, x satisfies the mathematical formula (1) when the element A is Ba, and satisfies the mathematical formula (2) when the element A is Ca.

$$0 \leq x \leq 0.5 \quad (1)$$

$$0 \leq x \leq 0.2 \quad (2)$$

Further, y and z satisfy the following mathematical formulae (3) and (4), respectively.

$$0 \leq y \leq 0.3 \quad (3)$$

$$0 \leq z \leq 0.5 \quad (4)$$

When x, y and z are out of the above-mentioned ranges (1) to (4), there is a possibility that a heterogenous phase is precipitated, or the crystal structure of a porcelain changes due to excessive element displacement or the like, and therefore the ferromagnetic dielectric properties are deteriorated, or the insulating property is deteriorated.

Accordingly, although an oxide ceramic having performance appropriate to the intended use can be obtained by replacing a part of Sr with Ba or Ca, or by replacing a part of Co with Ni, Zn or Mg and lacking Fe as required, even in this case, it is necessary to adjust x, y and z so as to satisfy the mathematical formulae (1) to (4) from the viewpoint of ensuring the desired ferromagnetic dielectric properties and insulation performance.

Further, in the above-mentioned embodiment, a ferrite compound of a hexagonal Z-type structure having a lamination period of an R block, an S block and a T block has been described; however, a crystal system, in which a part of a periodic structure of the lamination period is collapsed, and symmetry of the crystal is lower than in a hexagonal system, may be used.

Further, a crystal system, in which ions coordinated at a predetermined atomic position of a crystal lattice are slightly displaced therefrom and the symmetry of the crystal is lower than in a hexagonal system, may be used. For example, in the hexagonal Z-type structure, ions constituting a crystal, such as $O^{2-}$, $Co^{2+}$ and $Zn^{2+}$, are coordinated at the predetermined atomic position whose space group describing the symmetry of the crystal is defined by $P6_3/mmc$. However, the present invention can also be applied to a crystal structure in which the above-mentioned ions migrate from the above-mentioned predetermined atomic position and are coordinated at the atomic position which is defined by another space group, and the symmetry of the crystal is lower than in a hexagonal system.

That is, in the present oxide ceramic, it is important to include the above-mentioned predetermined amount of Zr in the ferrite compound containing at least Sr, Co, and Fe, and even the ferrite compound of a crystal system slightly lower in symmetry of the crystal than the hexagonal crystal system can achieve a desired object of the present invention.

Next, a method of producing the present oxide ceramic will be described in detail.

As ceramic base materials, an iron compound such as $Fe_2O_2$, a strontium compound such as $SrCO_3$, a cobalt compound such as $Co_3O_4$ and a zirconium compound such as $ZrO_2$, and as required, a nickel compound such as NiO, a magnesium compound such as $MgCO_3$, a zinc compound such as ZnO, a calcium compound such as $CaCO_3$, and a barium compound such as $BaCO_3$ are prepared.

Then, taking into account that a chemical component in the grinding medium may be mixed in the oxide ceramic, the above-mentioned ceramic base materials are weighed in such a way that zirconium is contained in an amount of 0.05 to 1.0 wt. % on an oxide equivalent basis in an oxide ceramic after firing, and the composition of the principal component after firing preferably satisfies the mathematical formulae (1) to (4) in the above-mentioned general formula (A).

That is, in general, the oxide ceramic is prepared by charging the ceramic base materials into a grinding machine together with a grinding medium, a solvent and other additives, subjecting the materials to a mixing-grinding treatment, and firing the resulting mixture. Also in the present embodiment, the oxide ceramic is prepared by undergoing these steps.

As the grinding medium, partially stabilized zirconium (hereinafter, referred to as "PSZ") balls or steel balls made of stainless steel (SUS 304) are usually used.

Among these grinding media, as to the PSZ balls, a stabilizer such as $Y_2O_3$ (yttrium oxide) is added to $ZrO_2$ (zirconium oxide) to stabilize the crystal structure of $ZrO_2$. Accordingly, since the PSZ balls contain $ZrO_2$, $ZrO_2$ in the PSZ balls may possibly be mixed in the oxide ceramic by a mixing-grinding treatment in a grinding machine. Further, also when the steel balls are used, Fe in the steel balls may possibly be mixed in the oxide ceramic.

Particularly, since a hexagonal Z-type crystal structure of the $Sr_3Co_2Fe_{24}O_{41}$-based compound is, as described above, very complicated, there is a possibility that even the occurrence of minor deviation of composition causes changes in a magnetic order, and this may result in the deterioration of the ferromagnetic dielectric properties or the deterioration of insulation performance.

Thus, in the present embodiment, taking into account that a chemical component in the grinding medium may be mixed in the oxide ceramic, the above-mentioned ceramic base materials are weighed. Specifically, taking into account that $ZrO_2$ from the PSZ balls may be mixed in the oxide ceramic when PSZ balls are used as the grinding medium, and taking into account that Fe from the steel balls may be mixed in the oxide ceramic when steel balls are used as the grinding medium, the ceramic base materials are weighed.

Next, these weighed ceramic base materials are charged into a grinding machine such as a pot mill together with the above-mentioned grinding medium, a dispersant and a solvent such as pure water, and adequately mixed and ground to obtain a mixture.

Then, the obtained mixture is dried, granulated, and then calcined at a temperature of 1000 to 1100° C. for a predetermined time in the air atmosphere to obtain a calcined product.

Next, the calcined product is granulated, and then charged into a grinding machine again together with a grinding medium, a dispersant and an organic solvent such as ethanol or toluene, and adequately mixed and ground, and thereafter a binder solution is added thereto, and the resulting mixture is adequately mixed to obtain a ceramic slurry.

The binder solution is not particularly limited, and for example, a solution formed by dissolving an organic binder such as polyvinyl butyral resin in an organic solvent such as ethanol or toluene, and adding an additive such as a plasticizer as required, can be used.

Then, the ceramic slurry thus formed is formed into a sheet shape by using a forming process such as a doctor blade method, and the sheet-shaped formed body is cut to a predetermined dimension to obtain a ceramic green sheet. A predetermined number of the ceramic green sheets are laminated and press-bonded, and then cut to a predetermined dimension to obtain a ceramic formed body.

Then, the ceramic formed body is subjected to a debinder treatment at 300° C. to 500° C. in the air atmosphere, and thereafter fired at 1150° C. to 1250° C. in the air atmosphere to prepare the above-mentioned oxide ceramic of the ferromagnetic dielectric body.

As described above, with the above-mentioned oxide ceramic, since the principal component of the oxide ceramic is formed of a ferrite compound containing at least Sr, Co, and Fe and zirconium is contained in an amount of 0.05 to 1.0 wt. % on an oxide equivalent basis, the sinterability is improved by the action of the zirconium oxide. Further, zirconium is uniformly or substantially uniformly distributed in the oxide ceramic to promote the densification of the oxide ceramic and promote grain growth. Thereby, it becomes possible to obtain an oxide ceramic which has good insulation performance and ferromagnetic dielectric properties, and is suitable for industrial production due to its high yield and capability of stable production.

Then, as described later, when the oxide ceramic is subjected to magnetic polarization and electric polarization, the oxide ceramic comes to have a desired large electromagnetic effect.

Further, it becomes possible to realize various novel and useful ceramic electronic components by using the present oxide ceramic.

Hereinafter, various preferred embodiments of the ceramic electronic component will be described illustratively.

Figure 2:
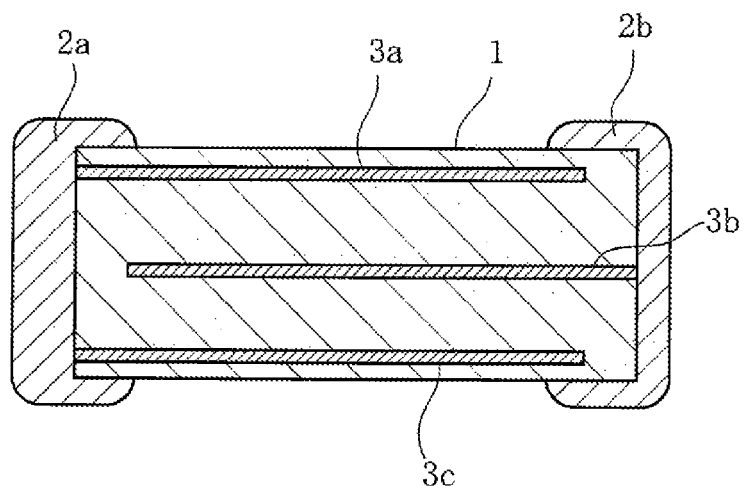
FIG. 2 is a sectional view of the first embodiment.

FIG. 1 is a front view showing a first embodiment of a ceramic electronic component, and FIG. 2 is a sectional view thereof.

This ceramic electronic component has a component base body 1 formed of the above-mentioned oxide ceramic, and external electrodes 2a and 2b formed at both ends of the component base body 1.

Further, in this ceramic electronic component, a coil is arranged so that a magnetic flux passes through the component base body 1 when a high-frequency signal flows. Specifically, in the first embodiment, a coil 4 made of a conductive material such as Cu is wound around the component base body 1 so as to suspend between external electrodes 2a and 2b.

Moreover, internal electrodes 3a to 3c are embedded in parallel in the component base body 1. Among these internal electrodes 3a to 3c, each of first internal electrodes 3a and 3c is electrically connected to one of the external electrodes 2a, and a second internal electrode 3b is electrically connected to the other of the external electrodes 2b. The ceramic electronic component is enabled to acquire a capacitance between the first internal electrode 3a and the second internal electrode 3b and between the second internal electrode 3b and the first internal electrode 3c.

Here, electrode materials for forming the external electrodes 2a and 2b and the internal electrodes 3a to 3c are not particularly limited as long as they have a good conductive property, and various metal materials such as Pd, Pt, Ag, Ni and Cu can be used.

In the ceramic electronic component thus configured, since the component base body 1 is formed of the above-mentioned oxide ceramic composed of the ferromagnetic dielectric body and the coil 4 is wound around the component base body 1 so as to suspend between the external electrode 2a and the external electrode 2b, when a high-frequency signal is input in the coil 4, the magnetic flux generated in the direction of the arrow A passes through the component base body 1 to obtain an inductance in accordance with the number of turns of the coil, the shape of an element and the magnetic permeability of the component base body 1. Further, when the electric field (voltage) is applied to the external electrodes 2a and 2b, a change in magnetization (change in magnetic permeability) occurs by the electromagnetic effect to make it possible to vary an inductance L of a coil. Thus, it becomes possible to control a change rate $\Delta L$ of the inductance L by changing the electric field (voltage).

The ceramic electronic component can be produced as follows.

First, a ceramic green sheet is prepared by following the same method and procedure as in the above-mentioned method of producing an oxide ceramic.

Then, a conductive paste for an internal electrode containing a conductive material such as Pd as a principal component is prepared. The conductive paste for an internal electrode is applied onto a ceramic green sheet, and a conductive layer with a predetermined pattern is formed on the surface of the ceramic green sheet.

Thereafter, the ceramic green sheet having the conductive layer formed thereon and a ceramic green sheet not having a conductive layer are laminated in a predetermined order, and the resulting laminate is cut to a predetermined dimension to obtain a ceramic formed body.

Then, the ceramic formed body is subjected to a debinder treatment at 300° C. to 500° C. in the air atmosphere, thereafter fired at 1150° C. to 1250° C. in the air atmosphere, and further heat-treated in an oxygen atmosphere to prepare a component base body 1.

Then, a conductive paste for an external electrode containing Ag or the like as a principal component is applied to both ends of the component base body 1 and fired, and thereby, a ceramic electronic component can be prepared.

In addition, when the component base body 1 does not include an internal electrode, surface electrodes made of Pt, Ag or the like are formed on both principal surfaces of the component base body 1, and are subjected to polarization processing.

By the way, in order to achieve a larger electromagnetic effect, the polarization processing is preferably performed in the magnetic field. Hereinafter, the case in which the polarization processing is performed in the magnetic field will be described.

First, a magnetic field of 1 T or more is applied to perform magnetic polarization, and then an electric field of about 0.5 to 2 kV/mm is applied in a direction orthogonal to the direction of the magnetic field in a state in which the magnetic field is applied, and further the magnitude of the magnetic field is gradually decreased to 0.1 T to 0.5 T with the electric field applied, and thereby, the electric polarization is performed. By performing the polarization processing in the magnetic field in this manner, a larger electromagnetic effect can be achieved.

As described above, in this first embodiment, by applying the electric field, magnetization (magnetic permeability) can be varied to make it possible to vary an inductance L of a coil. Furthermore, by adjusting the electric field to be applied, the change rate of the inductance L can be controlled to make it possible to use the ceramic electronic component as a variable inductor.

Further, the present ceramic electronic component is also useful as a power generation element.

That is, in the present ceramic electronic component, the oxide ceramic becomes ferroelectric by application of the magnetic field, resulting in the emergence of a ferroelectric phase, and the oxide ceramic passes a displacement current of the electromagnetic current when the magnetic field disappears by non-application of the magnetic field. Accordingly, in an alternating-current magnetic field in which the emergence and extinction of the ferromagnetic phase is repeated, since the present ceramic electronic component continues to discharge charges (electromagnetic current), it can be used as a power generation element as well as an electromagnetic induction element. Furthermore, the larger the electric polarization P is, the larger the obtained energy is, and therefore it becomes possible to obtain a good power generation characteristic as long as the composition of the oxide ceramic falls within the range of the present invention.

Further, for example, when the above-mentioned ceramic electronic component is stuck to a flexible substrate such as a stainless steel substrate, and the substrate is vibrated in the magnetic field to vary the magnitude of the magnetic field to be added to the ceramic electronic component, desired power generating action is achieved, and therefore this can be used in the same way as a power generation element utilizing a piezoelectric body.

That is, in the power generation element utilizing a piezoelectric body, since the piezoelectric body itself is vibrated and distorted, there is a possibility that the piezoelectric body itself is damaged when a large force is applied.

In contrast, in the present ceramic electronic component, it is not necessary to distort the component base body itself, and it becomes possible to realize a power generation element having excellent durability.

Further, since the above-mentioned ceramic electronic component contains a zirconium oxide in an amount of 0.05 to 1.0 wt. % in the component base body 1, it is possible to obtain a ceramic electronic component suitable for industrial production due to high yield and capability of stable production of the oxide ceramic.

Figure 3:
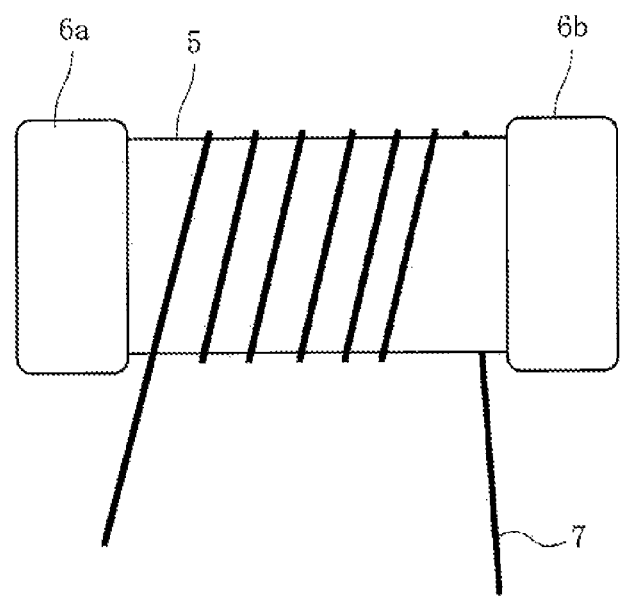
FIG. 3 is a front view showing a second embodiment of a ceramic electronic component.
Figure 4:
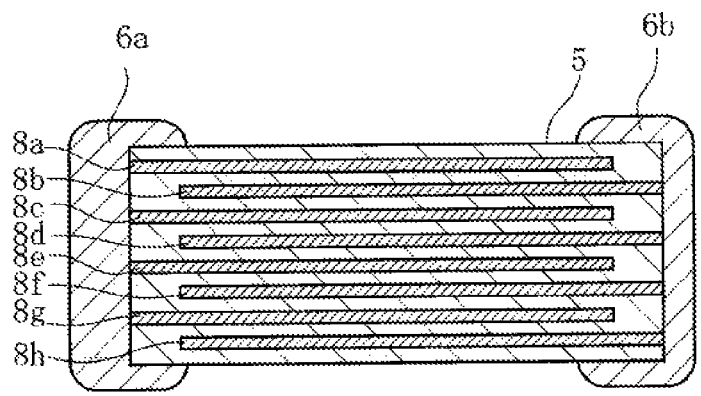
FIG. 4 is a sectional view of the second embodiment.

FIG. 3 is a front view showing a second embodiment of a ceramic electronic component, and FIG. 4 is a sectional view thereof.

That is, this ceramic electronic component has a component base body 5 formed of the above-mentioned oxide ceramic, and external electrodes 6a and 6b formed at both ends of the component base body 5, as with the first embodiment.

Further, also in this ceramic electronic component, a coil is arranged so that a magnetic flux passes through the component base body 5 when a high-frequency signal flows. In the second embodiment, a coil 7 made of a conductive material such as Cu is wound around the perimeter of the component base body 5 excluding external electrodes 6a and 6b.

The internal electrodes 8a to 8h are embedded in parallel in the component base body 5. Among these internal electrodes 8a to 8h, each of first internal electrodes 8a, 8c, 8e, and 8g is electrically connected to one of the external electrodes 6a, and each of second internal electrodes 8b, 8d, 8f, and 8h is electrically connected to the other of the external electrodes 6b. The ceramic electronic component is enabled to acquire a capacitance between the first internal electrodes 8a, 8c, 8e, and 8g and the second internal electrodes 8b, 8d, 8f, and 8h.

In the ceramic electronic component thus configured, since the component base body 5 is formed of the above-mentioned oxide ceramic composed of the ferromagnetic dielectric body and the coil 7 is wound around the perimeter of the component base body 5 excluding the external electrodes 6a and 6b, when a high-frequency signal is input in the coil 7, the magnetic flux passes through the component base body 1 to obtain an inductance in accordance with the magnetic permeability of the component base body 1. Further, when the electric field (voltage) is applied to the external electrodes 6a and 6b, the magnetization of the component base body 1 is changed by the electromagnetic effect to make it possible to vary an inductance L of a coil, and by varying the polarity and level of the voltage, a change rate ΔL of the inductance L can be controlled.

As described above, also in this second embodiment, as with the first embodiment, by applying the electric field, magnetization (magnetic permeability) can be varied to make it possible to vary an inductance L of a coil. Furthermore, by adjusting the electric field to be applied, the change rate of the inductance L can be controlled to make it possible to use the ceramic electronic component as a variable inductor.

Further, also in the second embodiment, as with the first embodiment, the oxide ceramic becomes ferroelectric by application of the magnetic field, resulting in the emergence of a ferroelectric phase, and the oxide ceramic passes a displacement current of the electromagnetic current when the magnetic field disappears by non-application of the magnetic field. Accordingly, in an alternating-current magnetic field in which the emergence and extinction of the ferromagnetic phase is repeated, since the present ceramic electronic component continues to discharge charges (electromagnetic current), it can also be used as a power generation element.

Furthermore, since the oxide ceramic contains a zirconium oxide in an amount of 0.05 to 1.0 wt. %, it is possible to obtain a ceramic electronic component, such as inductors or power generation elements, which has good insulation performance and ferromagnetic dielectric properties, and is suitable for industrial production due to its high yield and capability of stable production.

In addition, the second embodiment can also be easily produced by following the same method and procedure as in the first embodiment.

Figure 5:
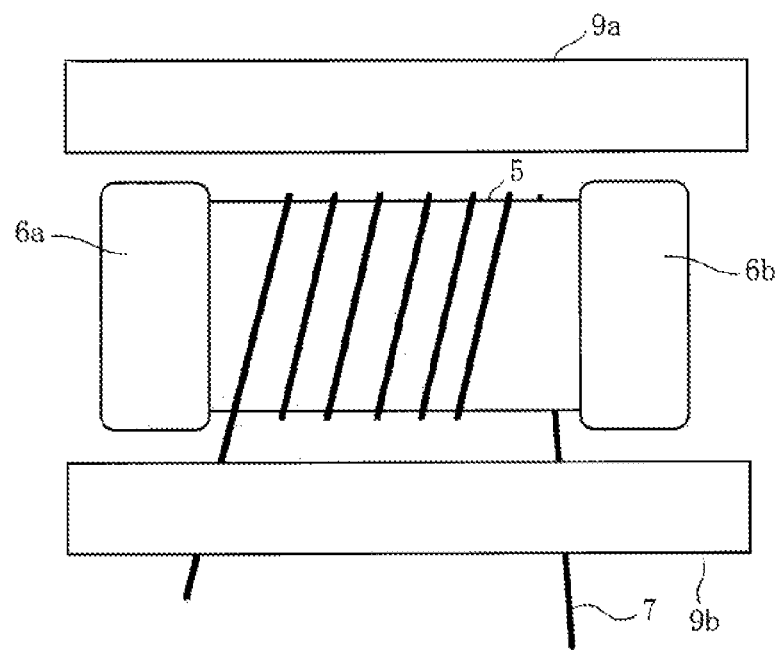
FIG. 5 is a front view showing a third embodiment of a ceramic electronic component.
Figure 6:
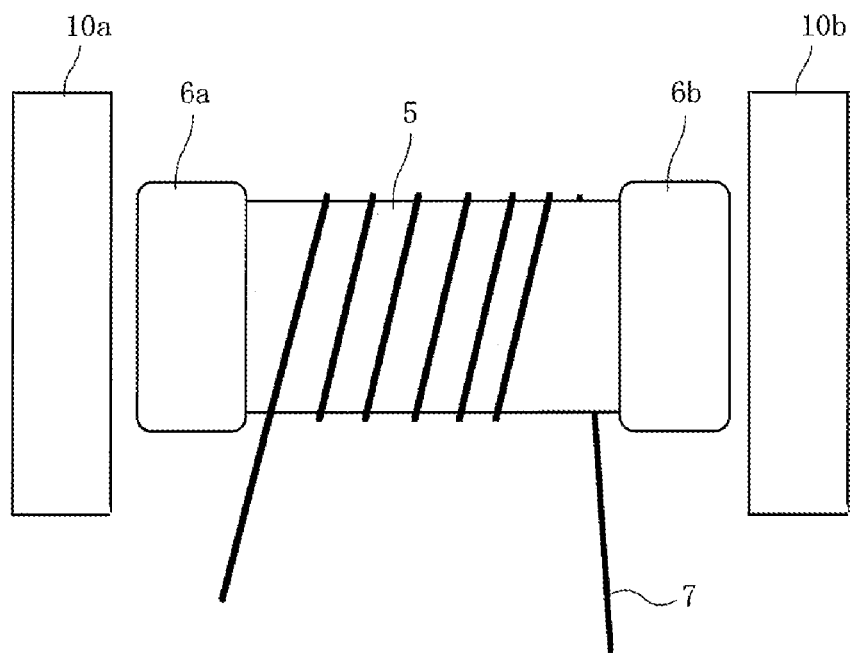
FIG. 6 is a front view showing a fourth embodiment of a ceramic electronic component.

FIG. 5 is a front view showing a third embodiment of a ceramic electronic component, and FIG. 6 is a front view showing a fourth embodiment of a ceramic electronic component.

That is, in the third embodiment, in addition to the configuration of the second embodiment, permanent magnets 9a and 9b for applying a fixed magnetic field are disposed in parallel with the longitudinal direction of the component base body 5 in the vicinity of the component base body 5.

Further, in the fourth embodiment, in addition to the configuration of the second embodiment, permanent magnets 10a and 10b for applying a fixed magnetic field are disposed in parallel with the external electrodes 6a and 6b in the vicinity of the external electrodes 6a and 6b.

As with the third and fourth embodiments, in addition to the configuration of the second embodiment, permanent magnets 9a, 9b, 10a, and 10b may be disposed at predetermined positions to apply a fixed magnetic field.

In addition, the permanent magnets 9a, 9b, 10a, and 10b are not particularly limited, and any magnet such as a ferrite magnet or a neodymium magnet can be used.

Figure 7:
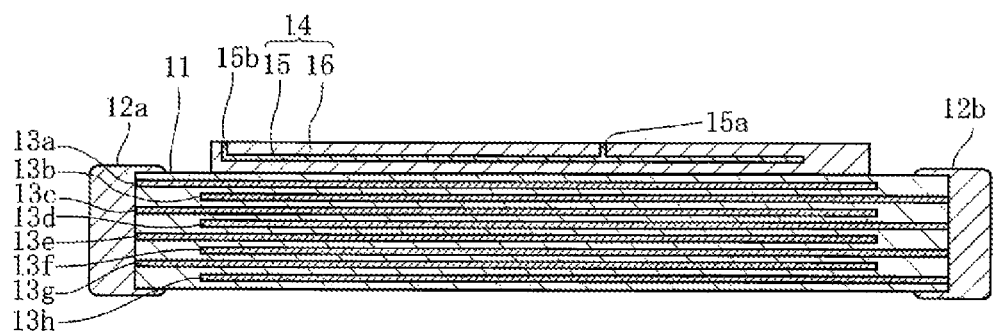
FIG. 7 is a sectional view showing a fifth embodiment of a ceramic electronic component.

FIG. 7 is a sectional view showing a fifth embodiment of a ceramic electronic component.

That is, this ceramic electronic component has a component base body 11 formed of the above-mentioned oxide ceramic, and external electrodes 12a and 12b formed at both ends of the component base body 11, substantially as with the first to fourth embodiments.

Further, internal electrodes 13a to 13h are embedded in parallel in the component base body 11. Among these internal electrodes 13a to 13h, each of first internal electrodes 13a, 13c, 13e, and 13g is electrically connected to one of the external electrodes 12a, and each of second internal electrodes 13b, 13d, 13f, and 13h is electrically connected to the other of the external electrodes 12b.

Then, in this fifth embodiment, a planar coil 14 is formed on one principal surface of the component base body 11.

Figure 8:
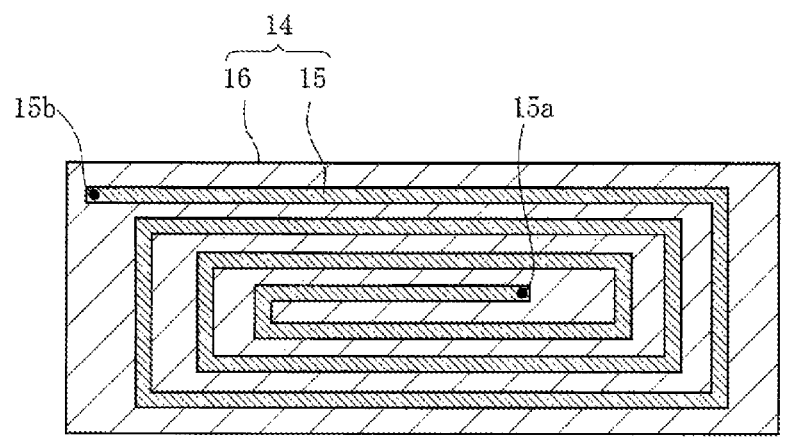
FIG. 8 is a sectional view of a magnetic layer in the fifth embodiment.

FIG. 8 is a sectional view of the planar coil 14.

That is, in the planar coil 14, an internal conductor (coil conductor) 15 in which a coil pattern is formed planarly is embedded in an insulating body 16. Via holes 15a and 15b are formed at both ends of the internal conductor 15, and the internal conductor 15 is enabled to be connected to an external signal line through the via holes 15a and 15b.

As described above, also in this fifth embodiment, by applying the electric field with the magnetic field applied, magnetization can be varied to make it possible to vary an inductance L of a coil. Furthermore, by adjusting the electric field to be applied, the change rate of the inductance L can be controlled to make it possible to use the ceramic electronic component as a variable inductor.

Further, also in the fifth embodiment, as with the above-mentioned embodiments, the oxide ceramic becomes ferroelectric by application of the magnetic field, resulting in the emergence of a ferroelectric phase, and the oxide ceramic passes a displacement current of the electromagnetic current when the magnetic field disappears by non-application of the magnetic field. Accordingly, in an alternating-current magnetic field in which the emergence and extinction of the ferromagnetic phase is repeated, since the present ceramic electronic component continues to discharge charges (electromagnetic current), it can also be used as a power generation element.

Furthermore, since the oxide ceramic contains a zirconium oxide in an amount of 0.05 to 1.0 wt. %, it is possible to obtain a ceramic electronic component, such as inductors or power generation elements, which has good insulation performance and ferromagnetic dielectric properties, and is suitable for industrial production due to its high yield and capability of stable production.

Further, in the fifth embodiment, the coil pattern of the internal conductor 15 is formed into a spiral shape; however, the coil pattern is not limited to this, and any shape such as a meander shape like a winding road may be employed.

Moreover, in the fifth embodiment, the planar coil 14 is formed directly on one principal surface of the component base body 11; however, an insulating layer may be interposed between the component base body 11 and the planar coil 14, or the planar coil 14 may be formed on both principal surfaces of the component base body 11.

In addition, the ceramic electronic component can be easily produced by preparing a component base body 11 by the same method and procedure as in the first embodiment, and applying publicly known thin-film/microfabrication process techniques to one principal surface of the component base body 11 by use of an insulating material such as $SiO_2$ or SiN and a conductive material such as Cu.

Figure 9:
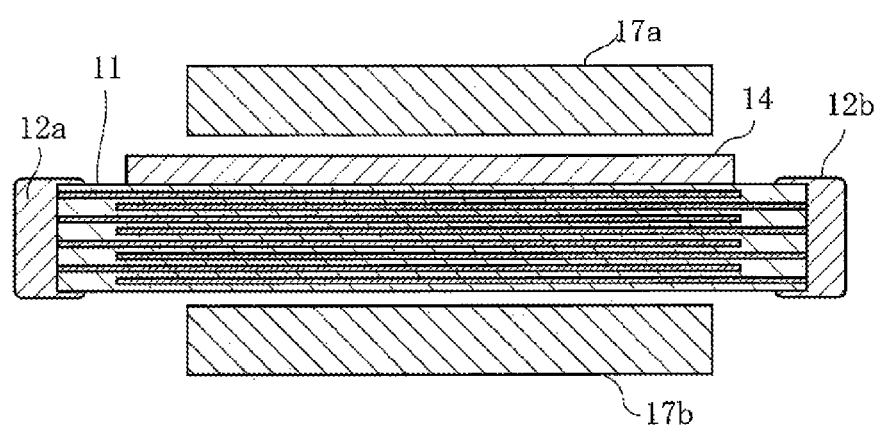
FIG. 9 is a sectional view showing a sixth embodiment of a ceramic electronic component.
Figure 10:
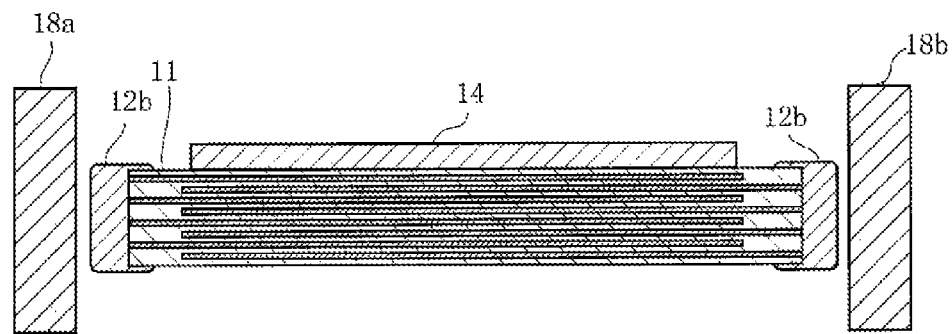
FIG. 10 is a sectional view showing a seventh embodiment of a ceramic electronic component.

FIG. 9 is a sectional view showing a sixth embodiment of a ceramic electronic component, and FIG. 10 is a sectional view showing a seventh embodiment of a ceramic electronic component.

That is, in the sixth embodiment, in addition to the configuration of the fifth embodiment, permanent magnets 17a and 17b for applying a fixed magnetic field are disposed in parallel with the longitudinal direction of the component base body 11 in the vicinity of the component base body 11.

Further, in the seventh embodiment, in addition to the configuration of the fifth embodiment, permanent magnets 18a and 18b for applying a fixed magnetic field are disposed in parallel with the external electrodes 13a and 13b in the vicinity of the external electrodes 13a and 13b.

Thus, substantially as with the third and fourth embodiments, in addition to the configuration of the fifth embodiment, permanent magnets 17a, 17b, 18a, and 18b may be disposed at predetermined positions to apply a fixed magnetic field.

In addition, the present invention is not limited to the above-mentioned embodiments. For example, in the first to seventh embodiments, the internal electrode is embedded in the component base body; however, an electrode for applying a voltage may be prepared in the form of being exposed to the surface from the component base body so that a voltage is directly applied to the electrode without an external electrode.

Further, in the above-mentioned third, fourth, sixth, and seventh embodiments (FIGS. 5, 6, 9 and 10), two permanent magnets are disposed in the vicinity of a longitudinal direction or in the vicinity of the external electrodes of the component base body; however, the permanent magnet may be either one. Further, in the fifth embodiment (FIG. 7 and FIG. 8), the magnetic layer is laminated on one principal surface of the component base body; however, the magnetic layer may be disposed on both principal surfaces of the component base body so as to sandwich the component base body therebetween.

Moreover, the present invention is applicable to various ceramic electronic components other than the above-mentioned variable inductor and power generation element. For example, the present invention can be used for a magnetic sensor which outputs a current according to the magnitude of a magnetic field, and thereby, it becomes possible to realize a compact and simple magnetic sensor. Moreover, since the ceramic electronic component of the present invention outputs a current even when a current flows through a coil to form a magnetic field, the present invention can also be used for a current sensor which outputs a current according to the magnitude of a magnetic field formed by a current having flowed through the coil.

Further, in the above-mentioned embodiment, the electric polarization is performed in the magnetic field in a direction orthogonal to the direction of the magnetic field; however, when the crystal grain is a polycrystal, a large electromagnetic effect can be achieved even if the direction of the magnetic field and the direction of the electric polarization are the same.

Further, a larger electromagnetic effect can also be achieved when the application of the magnetic field is stopped after the magnetic polarization and the electric polarization is performed, and these can be appropriately selected according to the type of usage or the environment of usage.

Next, examples of the present invention will be specifically described.

Example 1

Preparation of Sample $Fe_2O_3$, $SrCO_3$, $CO_3O_4$, and $ZrO_2$ were prepared as ceramic base materials.

Then, taking into account that a chemical component in the grinding medium may be mixed in a ceramic sintered body, the above-mentioned ceramic base materials were weighed in such a way that the composition of the principal component after firing was $Sr_3Co_2Fe_{24}O_{41}$, and the ceramic sintered body (oxide ceramic) after firing contained $ZrO_2$ in an amount of 0 to 1.2 wt. %.

That is, in the present example, although steel balls made of stainless steel (SUS 304) or PSZ balls were used as a grinding medium in a mixing-grinding treatment in a grinding machine described later, as described in "MODE FOR CARRYING OUT THE INVENTION," $ZrO_2$ contained in the PSZ balls may possibly be mixed in a ceramic sintered body after firing, and Fe contained in the steel balls may possibly be mixed in a ceramic sintered body after firing.

Thus, in the present example, weighing of the ceramic base materials was adjusted so that an oxide ceramic having the desired composition is obtained after firing.

That is, the present inventors performed experiments separately, and consequently they found that the amount of $ZrO_2$ from the PSZ balls and the amount of Fe from the steel balls, which are mixed in the oxide ceramic, vary with calcination conditions, grinding time, weight of the grinding medium and weight of the weighed ceramic base materials.

For example, when the PSZ balls were used as the grinding medium, the total weight of 120 g of the PSZ balls and the ceramic base materials was examined, and consequently it was found that 0.2 wt. % of $ZrO_2$ from the PSZ balls was mixed in the ceramic sintered body. Further, when the steel balls were used as the grinding medium, the total weight of 120 g of the steel balls and the ceramic base materials was examined, and consequently it was found that Fe was mixed in the ceramic sintered body in excess of 1.6 wt. % on the $Fe_2O_3$ equivalent basis.

Thus, when a sample having a content of $ZrO_2$ of less than 0.2 wt. % is prepared, the steel balls are used as the grinding medium, and a reduced amount of $Fe_2O_3$ was weighed so that the content of Fe in the ceramic sintered body was as desired. Further, when a sample having a content of $ZrO_2$ of 0.2 wt. % or more is prepared, $ZrO_2$ was weighed taking into account that $ZrO_2$ may be mixed in the oxide ceramic.

Next, the ceramic base materials thus weighed were charged into a pot mill made of polyethylene together with the above-mentioned grinding medium (steel balls or PSZ balls), an aqueous polymer dispersant (produced by Kao Corporation, KAOCER 2210) and pure water, and mixed and ground for 24 hours to obtain a mixture.

Then, the obtained mixture was dried, granulated, and then calcined at a temperature of 1100° C. for 2 hours in the air atmosphere to obtain a calcined product.

On the other hand, a polyvinyl butyral-based binder resin (produced by SEKISUI CHEMICAL CO., LTD., S-LEC B "BM-2") was separately dissolved in a mixed solvent of ethanol and toluene, and a plasticizer was added to prepare a binder solution.

Next, the calcined product was granulated, and then charged into a pot mill again together with a grinding medium, a solvent-based dispersant (produced by Kao Corporation, KAOCER 8000) and a mixed solvent of ethanol and toluene, and mixed and ground for 24 hours, and thereafter the above-mentioned binder solution was added thereto, and the resulting mixture was mixed again for 12 hours to obtain a ceramic slurry.

Then, the ceramic slurry thus formed was formed into a sheet shape having a thickness of about 50 μm by using a doctor blade method, and the sheet-shaped formed body was cut to a predetermined dimension by use of a die to obtain a ceramic green sheet. A predetermined number of the ceramic green sheets were laminated, and press-bonded at a pressure of 200 MPa, and then cut to obtain a ceramic formed body of 12 mm long, 20 mm wide and 1.2 mm thick.

Then, the ceramic formed body was subjected to a debinder treatment at 500° C. in the air atmosphere, and thereafter was fired at 1190° C. for 18 hours in the air atmosphere, and then heat-treated at a temperature of 1150° C. for 10 hours in an oxygen atmosphere to obtain a component base body (oxide ceramic).

Then, Pt as a target substance was sputtered on both principal surfaces of the component base body to prepare a surface electrode having a thickness of about 300 mm, whereby samples of sample Nos. 1 to 15 were obtained.

Composition analysis of each of the samples of sample Nos. 1 to 15 was conducted by using inductively coupled plasma (ICP) emission spectrometric analysis and fluorescent X-ray (XRF) analysis. As a result, it was confirmed that the composition of the principal component was $Sr_3Co_2Fe_{24}O_{41}$ and $ZrO_2$ was contained in an amount of 0 to 1.2 wt. %. Further, the crystal structure of each sample was analyzed by the X-ray diffraction (XRD) method, and consequently it was confirmed that a principal component of each sample had a hexagonal Z-type crystal structure.

Next, each of the samples of sample Nos. 1 to 15 was subjected to polarization processing.

Figure 11:
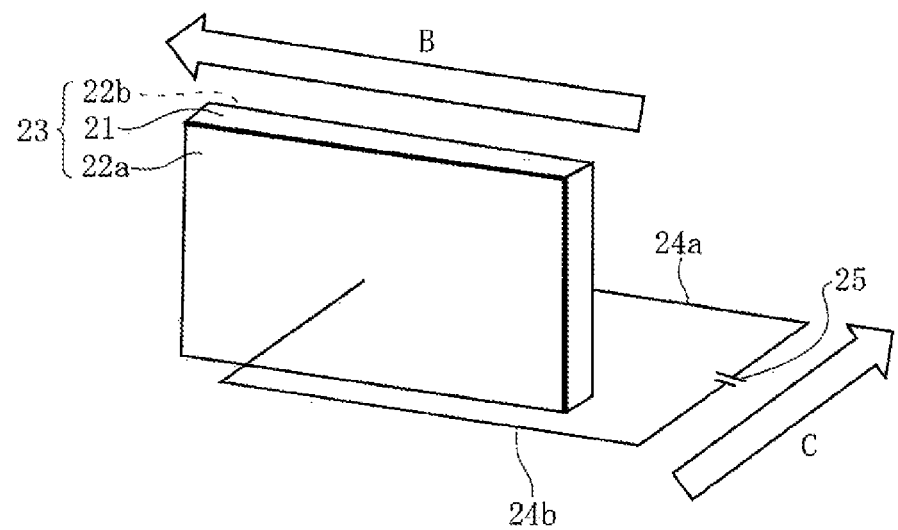
FIG. 11 is a perspective view schematically showing a polarization processing apparatus used in Examples.

FIG. 11 is a perspective view schematically showing a polarization processing apparatus.

That is, in this polarization processing apparatus, signal lines 24a and 24b are connected to a sample 23 including surface electrodes 22a and 22b formed on both principal surfaces of a component base body 21, and a DC power source 25 is interposed between the signal line 24a and the signal line 24b.

The sample 23 has an internal electrode as described above, and is place so that the direction (indicated by the arrow B) of the magnetic field applied to the sample 23 is orthogonal to the direction (indicated by the arrow C) of the electric field in which the electric polarization is performed.

First, using an electromagnet (not shown), a DC magnetic field of 1.5 T was applied at room temperature for 1 minute to perform the magnetic polarization in the direction of the arrow B. Then, the magnitude of the magnetic field was gradually decreased from 1.5 T to 0.5 T while applying an electric field of 800 V/mm between the surface electrodes 22a and 22b, and the electric polarization was performed for 3 minutes in the direction of the arrow C in a magnetic field of 0.5 T. It becomes possible to achieve a larger electromagnetic effect by performing the polarization processing in the magnetic field in this manner.

Next, the application of the electric field and the magnetic field was stopped, and the sample for evaluation was left standing for about 1 hour. It becomes possible to achieve a much larger electromagnetic effect by leaving the sample for a predetermined time after performing the polarization processing in this manner.

[Evaluation of Sample]

The electromagnetic current of each sample was measured, and characteristics of the samples were evaluated.

Figure 12:
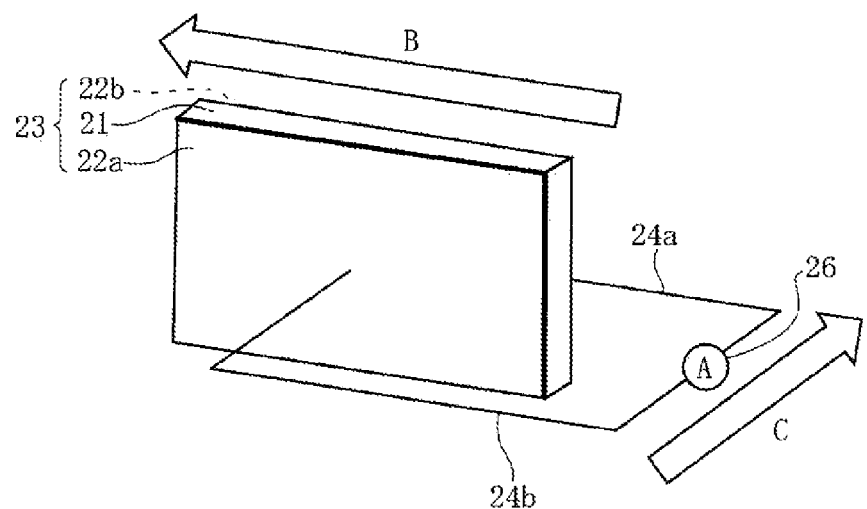
FIG. 12 is a perspective view schematically showing a characteristic evaluation apparatus used in Examples.

FIG. 12 is a perspective view schematically showing an apparatus for evaluation of characteristics of the sample 23.

The apparatus for evaluation of characteristics is equipped with a picoammeter (manufactured by Keithley Instruments, Inc., U.S.A., Model 6487) 26 in place of the DC power source 25 in FIG. 11, and the sample for evaluation was placed so that the direction B of the magnetic field applied was orthogonal to the direction C of the electric field during the electric polarization, as with FIG. 11.

Then, the magnetic field was swept reciprocally plural times at a speed of 1.7 T/min in a magnetic field range of 0 to 0.21 T by use of an electromagnet while controlling the temperature at 25° C. with a low temperature cryostat (manufactured by TOYO Corporation, model LN-Z), and charges discharged from the sample at this time, that is, an electromagnetic current, was measured with the picoammeter 26.

Figure 13:
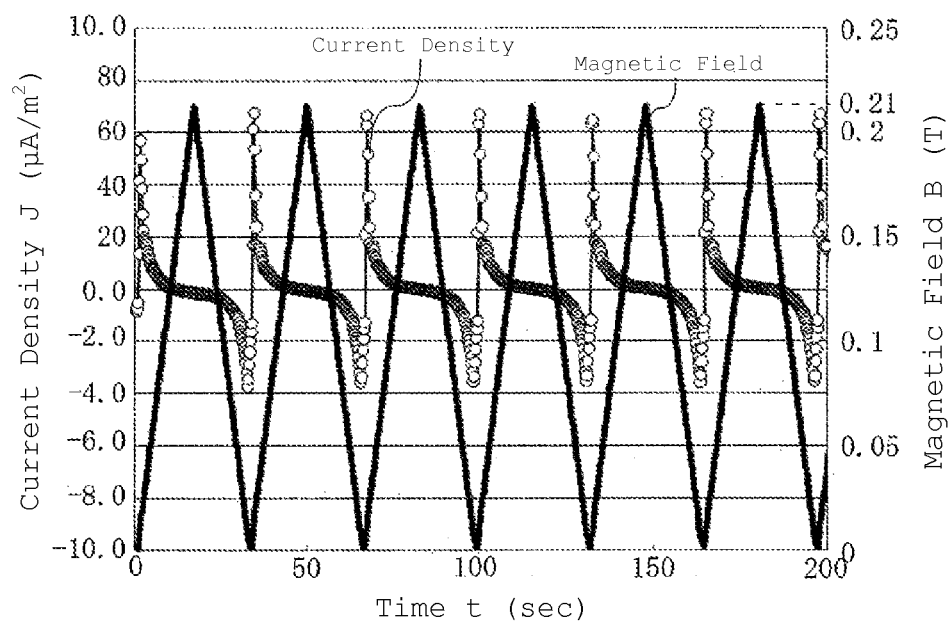
FIG. 13 is a chart showing an example of a current density characteristic of the oxide ceramic.

FIG. 13 is a chart showing a current density characteristic of sample No. 4.

The horizontal axis of FIG. 13 indicates a time t (sec), the right vertical axis indicates a magnetic field B (T), and the left vertical axis indicates a current density J ($\mu A/m^2$).

As is apparent from FIG. 13, an electromagnetic current was generated from the sample for evaluation when the magnetic field was swept reciprocally plural times from 0 T to 0.21 T. That is, when a magnetic field is applied to the sample for evaluation subjected to magnetic polarization and electric polarization, the sample passes the electromagnetic current resulting from development and extinction of the ferroelectricity, and therefore it was verified that the component base body becomes ferroelectric in the magnetic field.

Further, the current density of the electromagnetic current was integrated with respect to the time to determine the electric polarization P serving as an index of the ferroelectricity.

Figure 14:
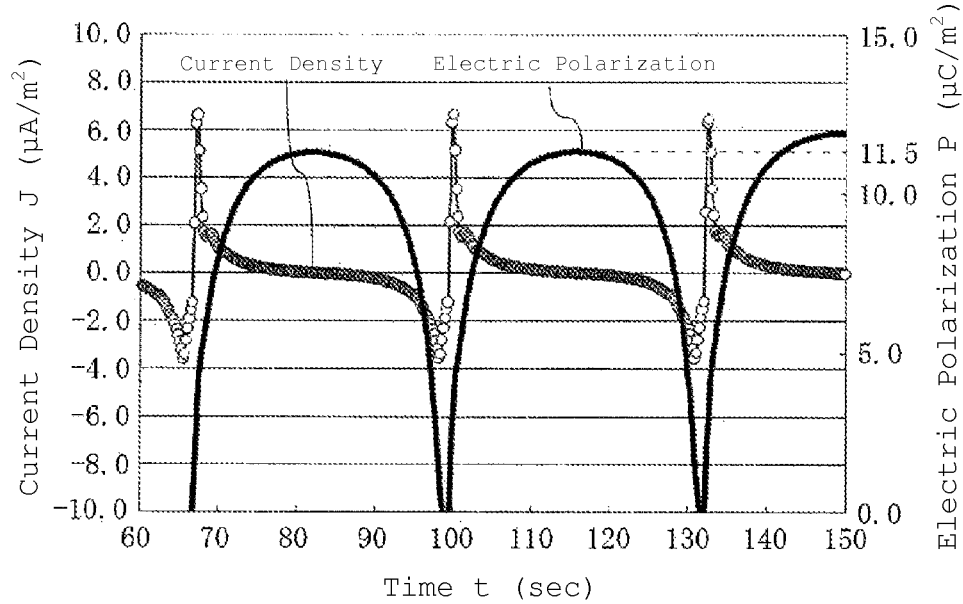
FIG. 14 is a chart showing an example of an electric polarization characteristic of the oxide ceramic.

FIG. 14 is a chart showing an electric polarization characteristic of sample No. 4.

The horizontal axis of FIG. 14 indicates a time (sec), the right vertical axis indicates an electric polarization P ($\mu C/m^2$), and the left vertical axis indicates a current density J ($\mu A/m^2$).

As is apparent from FIG. 14, the higher the current density J was, the larger electric polarization P was obtained, and in sample No. 4, a large electric polarization P of 11.5 $\mu C/m^2$ was obtained, and therefore it was found that the ferroelectricity was exhibited.

The electromagnetic current of each of samples of sample Nos. 1 to 3 and 5 to 15 was measured as with the above-mentioned samples to determine the electric polarization P.

In addition, since the electric polarization P is known to vary slightly depending on not only the ceramic composition but also the conditions of the magnetic polarization and electric polarization described above, polarization processing was performed under the same conditions for all samples.

Moreover, a specific resistance $\rho$ of each of samples of sample Nos. 1 to 15 was measured by a two-terminal method by using Electrometer (manufactured by ADC CORPORATION, model 8252).

Table 1 shows the content of $ZrO_2$, kind of the grinding medium, electric polarization P, and specific resistance $\rho$ of the samples of sample Nos. 1 to 15.

Here, a sample for which the electric polarization P was 10 $\mu C/m^2$ or more and the specific resistance $\rho$ was 100 $M\Omega \cdot cm$ or more was rated as a non-defective product having good ferromagnetic dielectric properties and insulation performance, and a sample for which the electric polarization P was less than 10 $\mu C/m^2$ or the specific resistance $\rho$ was less than 100 $M\Omega \cdot cm$ was rated as a defective product.

TABLE 1

| Sample No. | Content of $ZrO_2$ (wt %) | Grinding medium | Electric Polarization ($\mu C/m^2$) | Specific Resistance $\rho$ ($M\Omega \cdot cm$) |
|---|---|---|---|---|
| 1* | 0.0 | Steel balls | 8.8 | 196 |
| 2* | 0.01 | Steel balls | 8.7 | 198 |
| 3 | 0.05 | Steel balls | 11.2 | 193 |
| 4 | 0.1 | Steel balls | 11.5 | 191 |
| 5 | 0.5 | Steel balls | 14.8 | 185 |
| 6 | 0.8 | Steel balls | 13.1 | 184 |
| 7 | 1.0 | Steel balls | 12.9 | 162 |
| 8* | 1.2 | Steel balls | 5.6 | 81 |
| 9 | 0.2 | PSZ balls | 13.9 | 187 |
| 10 | 0.3 | PSZ balls | 14.1 | 180 |
| 11 | 0.4 | PSZ balls | 15.1 | 172 |
| 12 | 0.5 | PSZ balls | 14.5 | 156 |
| 13 | 0.8 | PSZ balls | 13.9 | 161 |
| 14 | 1.0 | PSZ balls | 13.3 | 124 |
| 15* | 1.2 | PSZ balls | 7.2 | 78 |

*indicates that the sample is out of the range of the present invention (claim 1).

As to sample No. 1, it was found that the electric polarization P was as small as 8.8 $\mu C/m^2$ and sufficient ferromagnetic dielectric properties cannot be attained since $ZrO_2$ is not contained in the component base body.

As to sample No. 2, it was found that the electric polarization P was as small as 8.7 $\mu C/m^2$ and sufficient ferromagnetic dielectric properties cannot be attained as with sample No. 1 since the content of $ZrO_2$ in the component base body was as low as 0.01 wt % and the effect of adding $ZrO_2$ was not adequately exerted.

In sample No. 8, since the content of $ZrO_2$ in the component base body was excessive, i.e. 1.2 wt %, the electric polarization P was reduced to 5.6 $\mu C/m^2$, and furthermore the specific resistance $\rho$ was as low as 81 $M\Omega \cdot cm$. The reason for this is probably as follows: since $ZrO_2$ was contained in an excessive amount more than 1.0 wt. %, a heterogenous phase such as a compound having a U-type crystal structure ($Sr_4Co_2Fe_{36}O_{60}$) and a compound having a W-type crystal structure ($SrCo_2Fe_{16}O_{27}$) was produced besides a compound having a Z-type crystal structure ($Sr_3Co_2Fe_{24}O_{41}$), and the crystal structure came to have an inhomogeneous microstructure.

Further, also in sample No. 15, since the content of $ZrO_2$ in the component base body was excessive, i.e. 1.2 wt %, the electric polarization P was reduced to 7.2 $\mu C/m^2$, and the specific resistance $\rho$ was also as low as 78 $M\Omega \cdot cm$ for the same reason as for sample No. 8.

In contrast, as to each of sample Nos. 3 to 7 and 9 to 14, it was found that the electric polarization P of each sample was 11.2 to 15.1 $\mu C/m^2$, which is 10 $\mu C/m^2$ or more, and good ferromagnetic dielectric properties can be attained since the content of $ZrO_2$ in the component base body was 0.05 to 1.0 wt %, which is within the range of the present invention. Furthermore, it was found that the specific resistance $\rho$ was as large as 124 to 198 $M\Omega \cdot cm$ and good insulation performance is obtained.

Next, the electromagnetic coupling coefficient $\alpha$ of each of the samples within the range of the present invention (sample Nos. 3 to 7 and 9 to 14) was determined.

The electromagnetic coupling coefficient $\alpha$ is known as an index of ferromagnetic dielectric properties and defined by the mathematical formula (5).

$$\alpha = \mu_0 (dP/dB) \qquad (5)$$

In the formula, $\mu_0$ is the magnetic permeability ($=4\pi \times 10^{-7}$ H/m) in a vacuum.

On the other hand, the current density J of the electromagnetic current can be represented by the mathematical formula (6).

$$J = dP/dt \quad (6)$$

Accordingly, a change in the electric polarization P with respect to a change in the magnetic field B (T) is represented by the mathematical formula (7).

$$dP/dB = (dP/dt)/(dB/dt) = J/(dB/dt) \quad (7)$$

In the formula, dB/dt represents a sweep speed of a magnetic field.

Substituting the mathematical formula (7) into the mathematical formula (5), the electromagnetic coupling coefficient $\alpha$ can be represented by the mathematical formula (8).

$$\alpha = (\mu_0 \cdot J)/(dB/dt) \quad (8)$$

Accordingly, the electromagnetic coupling coefficient $\alpha$ can be determined by dividing the product of the magnetic permeability $\mu_0$ in a vacuum and the current density J by the sweep speed of a magnetic field (dB/dt).

Then, an electromagnetic coupling coefficient $\alpha$ of each sample of sample Nos. 3 to 7 and 9 to 14 was determined based on the above-mentioned mathematical formula (8), and was found to be $1 \times 10^{-10}$ to $4 \times 10^{-10}$ s/m, and it was verified that good ferromagnetic dielectric properties are attained. Furthermore, it was also found that the larger the electric polarization P, namely, the current density J of the electromagnetic current is, the larger the obtained electromagnetic coupling coefficient $\alpha$ is.

In addition, in the present example, as described above, while the steel balls and the PSZ balls of the grinding medium were selectively used according to the desired content of $ZrO_2$, it was confirmed that the ceramic base materials need to be adjusted at the stage of weighing so that the content of $ZrO_2$ is 0.05 to 1.0 wt. % in the ceramic sintered body since both of the ferromagnetic dielectric properties and the insulation performance were deteriorated when the content of $ZrO_2$ exceeded 1.0 wt. %.

Example 2

NiO, $MgCO_3$, ZnO, $CaCO_3$, and $BaCO_3$ were prepared besides the ceramic base materials used in Example 1.

Ceramic base materials were weighed so that the composition of the component base bodies (ceramic sintered bodies) after sintering were as shown in Table 2, and thereafter, samples of sample Nos. 21 to 40 were prepared by the same method and procedure as in Example 1. However, in Example 2, since the ceramic base materials were blended so that the content of $ZrO_2$ was 0.4 to 1.0 wt. %, the PSZ balls were used for the grinding medium, and $ZrO_2$ was weighed taking into account that $ZrO_2$ from the PSZ balls may be mixed in the ceramic sintered body.

Further, the firing temperature was set at 1210° C. for sample Nos. 21 to 25, and set at 1190° C. for sample Nos. 26 to 40.

Then, each sample of sample Nos. 21 to 40 was analyzed by the same method and procedure as in Example 1, and its crystal structure was checked, and consequently it was verified that the sample had the composition shown in Table 2 and the principal component had a hexagonal Z-type crystal structure.

Then, after magnetic polarization and electric polarization were performed by following the same method and procedure as in Example 1, an electromagnetic current was measured and the electric polarization P was determined from the current density J of the electromagnetic current.

Further, the specific resistance $\rho$ was measured by the same method and procedure as in Example 1.

Table 2 shows the content of $ZrO_2$, kind of the grinding medium, electric polarization P, and specific resistance $\rho$ of the samples of sample Nos. 21 to 40.

In addition, as with Example 1, a sample for which the electric polarization P was 10 $\mu C/m^2$ or more and the specific resistance $\rho$ was 100 MΩ·cm or more was rated as a non-defective product, and a sample for which the electric polarization P was less than 10 $\mu C/m^2$ or the specific resistance $\rho$ was less than 100 MΩ·cm was rated as a defective product.

TABLE 2

| Sample No. | Composition of Principal Component: $Sr_{3-x}A_xCo_{2-y}M_yFe_{24-z}O_{41}$ | | | | | Content of $ZrO_2$ (wt %) | Grinding Medium | Electric Polarization ($\mu C/m^2$) | Specific Resistance $\rho$ (MΩ·cm) |
|---|---|---|---|---|---|---|---|---|---|
| | A | x | M | y | z | | | | |
| 21 | Ba | 0.2 | — | 0 | 0 | | PSZ balls | 13.2 | 120 |
| 22 | Ba | 0.5 | — | 0 | 0 | 0.4 | PSZ balls | 11.7 | 102 |
| 23 | Ba | 0.2 | — | 0 | 0 | 1.0 | PSZ balls | 11.2 | 110 |
| 24 | Ba | 0.5 | — | 0 | 0 | 1.0 | PSZ balls | 10.3 | 104 |
| 25** | Ba | 0.6 | — | 0 | 0 | 0.4 | PSZ balls | 7.1 | 126 |
| 26 | Ca | 0.2 | — | 0 | 0 | 0.4 | PSZ balls | 11.2 | 131 |
| 27 | Ca | 0.2 | — | 0 | 0 | 1.0 | PSZ balls | 10.9 | 128 |
| 28** | Ca | 0.3 | — | 0 | 0 | 0.4 | PSZ balls | 6.3 | 159 |
| 29 | — | 0 | Ni | 0.3 | 0 | 0.4 | PSZ balls | 10.3 | 119 |
| 30 | — | 0 | Ni | 0.3 | 0 | 1.0 | PSZ balls | 11.0 | 108 |
| 31** | — | 0 | Ni | 0.4 | 0 | 0.4 | PSZ balls | 7.8 | 120 |
| 32 | — | 0 | Mg | 0.3 | 0 | 0.4 | PSZ balls | 11.1 | 111 |
| 33 | — | 0 | Mg | 0.3 | 0 | 1.0 | PSZ balls | 10.7 | 121 |
| 34** | — | 0 | Mg | 0.4 | 0 | 0.4 | PSZ balls | 6.2 | 120 |
| 35 | — | 0 | Zn | 0.3 | 0 | 0.4 | PSZ balls | 10.3 | 127 |
| 36 | — | 0 | Zn | 0.3 | 0 | 1.0 | PSZ balls | 10.5 | 117 |
| 37** | — | 0 | Zn | 0.4 | 0 | 0.4 | PSZ balls | 4.3 | 21 |
| 38 | — | 0 | — | 0 | 0.5 | 0.4 | PSZ balls | 13.5 | 102 |
| 39 | — | 0 | — | 0 | 0.5 | 1.0 | PSZ balls | 12.4 | 108 |
| 40** | — | 0 | — | 0 | 1.0 | 0.4 | PSZ balls | 3.8 | 12 |

**indicates that the sample is out of the range of the present invention (claim 3).

As to sample No. 25, it was found that the electric polarization P was as low as 7.1 μC/m² and sufficient ferromagnetic dielectric properties cannot be attained since the substituent molar quantity of Ba with which a part of Sr is replaced was excessive, i.e. x was 0.6. The reason for this is probably as follows: since the substituent molar quantity of Ba was excessive, a magnetic order of a helical spin type, which is necessary for inducing sufficient electric polarization P, was not formed, and therefore the ferromagnetic dielectric properties were deteriorated.

As to sample No. 28, it was found that, as with sample No. 25, a magnetic order of a helical spin type, which is necessary for inducing sufficient electric polarization P, was not formed and further a heterogenous phase was easily produced, and therefore the electric polarization P was as low as 6.3 μC/m³ and sufficient ferromagnetic dielectric properties cannot be attained since the substituent molar quantity of Ca with which a part of Sr is replaced was excessive, i.e. x was 0.3.

As to each of sample Nos. 31, 34, and 37, it was found that the electric polarization P was as low as 7.8 μC/m², 6.2 μC/m² and 4.3 μC/m², respectively, and sufficient ferromagnetic dielectric properties cannot be attained since the substituent molar quantity of Ni, Mg or Zn with which a part of Co is replaced was excessive, i.e. y was 0.4. Particularly as to sample No. 37 in which a part of Co is replaced with Zn, it was found that the specific resistance ρ was 21 MΩ·cm and the insulation performance was extremely deteriorated.

As to sample No. 40, it was found that the crystal structure was changed, and therefore both of the electric polarization P and the specific resistance ρ were extremely low, i.e. 3.8 μC/m² and 12 MΩ·cm, respectively, since the lost molar quantity of Fe was excessive, i.e. z was 1.0.

In contrast, as to sample Nos. 21 to 24, 26, 27, 29, 30, 32, 33, 35, 36, 38, and 39, it was found that the electric polarization P of each sample was 10.3 to 13.5 μC/m², which is 10 μC/m² or more, and good ferromagnetic dielectric properties can be attained since x satisfies $0 \leq x \leq 0.5$ when the substituent element is Ba, and $0 \leq x \leq 0.2$ when the substituent element is Ca, and y and z satisfy $0 \leq y \leq 0.3$ and $0 \leq z \leq 0.5$. Furthermore, it was found that the specific resistance ρ was as large as 102 to 159 MΩ·cm and good insulation performance is obtained.

It was verified from the above that although a part of Sr can be replaced with Ba or Ca and a part of Co can be replaced with Ni, Mg or Zn as required, even in this case, the following relationship should be satisfied: $0 \leq x \leq 0.5$ when the substituent element is Ba, $0 \leq x \leq 0.2$ when the substituent element is Ca, $0 \leq y \leq 0.3$, and $0 \leq z \leq 0.5$.

Example 3

Preparation of Sample

A ceramic green sheet having the same composition as that of sample No. 10 of Example 1 was used, and a ceramic electronic component was prepared, which is similar to the first embodiment (refer to FIG. 1 and FIG. 2) described in "MODE FOR CARRYING OUT THE INVENTION."

That is, first, a ceramic green sheet having the same composition as that of sample No. 10 was prepared.

Then, a conductive paste for an internal electrode containing Pd as a principal component was applied onto the ceramic green sheet, and a conductive layer with a predetermined pattern was formed on the surface of the ceramic green sheet.

Then, the ceramic green sheet having the conductive layer formed thereon and a ceramic green sheet not having a conductive layer were laminated in a predetermined order, and the resulting laminate was cut to a predetermined dimension to prepare a ceramic formed body of 10 mm long, 20 mm wide and 2.2 mm thick.

Then, the ceramic formed body was subjected to a debinder treatment at 500° C. in the air atmosphere, thereafter fired at 1190° C. in the air atmosphere, and further heat-treated at a temperature of 1150° C. for 10 hours in an oxygen atmosphere to prepare a component base body.

Then, a conductive paste for an external electrode containing Ag as a principal component was applied to both ends of the component base body and fired at a temperature of 800° C., and thereby, a sample of sample No. 41 was prepared.

In addition, the total area of internal electrodes of the sample of sample No. 41 was about 1.5 cm², and the thickness of a ceramic layer sandwiched between the internal electrodes was about 1 mm.

[Evaluation of Sample]
(Ferromagnetic Dielectric Properties)

After magnetic polarization and electric polarization were performed by following the same method and procedure as in Example 1, an electromagnetic current was measured and the electric polarization P was determined from the current density J of the electromagnetic current.

Figure 15:
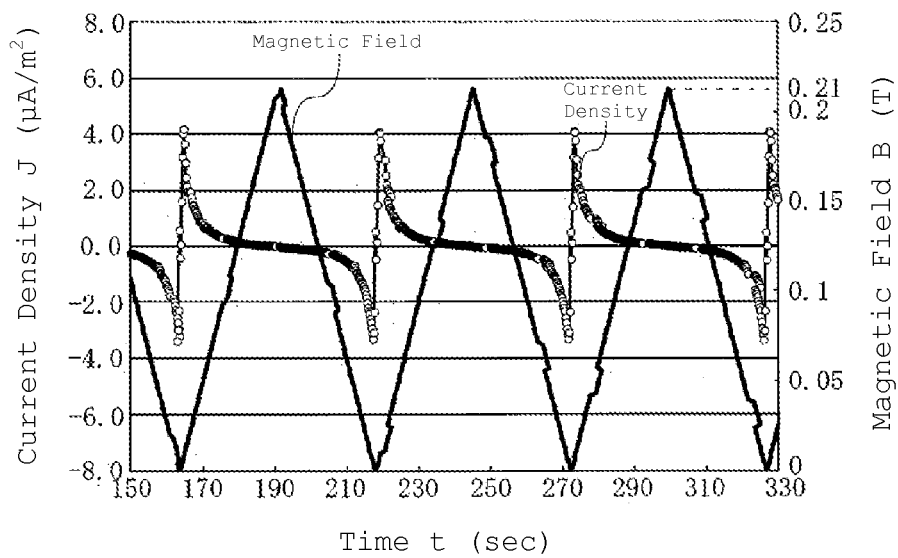
FIG. 15 is a chart showing an example of a current density characteristic of the ceramic electronic component.

FIG. 15 is a chart showing a current density characteristic of sample No. 41.

The horizontal axis of FIG. 15 indicates a time t (sec), the right vertical axis indicates a magnetic field B (T), and the left vertical axis indicates a current density J (μA/m²).

As is apparent from FIG. 15, as with Example 1 (FIG. 13), an electromagnetic current is generated when the magnetic field was swept reciprocally plural times from 0 T to 0.21 T. That is, when a magnetic field is applied to sample No. 41 subjected to magnetic polarization and electric polarization, the sample passes the electromagnetic current resulting from development and extinction of the ferroelectricity, and therefore it was verified that the oxide ceramic of the present invention constituting the component base body becomes ferroelectric in the magnetic field.

Figure 16:
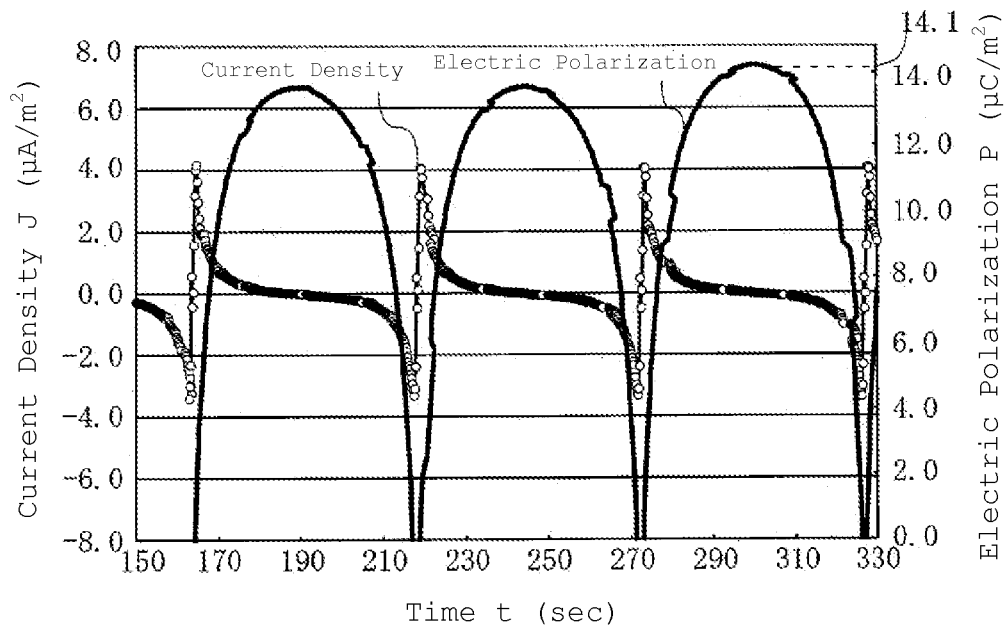
FIG. 16 is a chart showing an example of an electric polarization characteristic of the ceramic electronic component.

FIG. 16 is a chart showing an electric polarization characteristic of sample No. 41.

The horizontal axis of FIG. 16 indicates a time (sec), the right vertical axis indicates an electric polarization P (μC/m²), and the left vertical axis indicates a current density J (μA/m²).

As is apparent from FIG. 16, a large electric polarization P of 14.1 μC/m² was obtained, and this agrees with sample No. 10 of Example 1. Further, the electromagnetic coupling coefficient α of sample No. 41 was determined, and consequently, the maximum value was $3.0 \times 10^{-10}$ s/m at a magnetic field of 0.14 T.

Next, a coil was formed by winding a coated copper wire by ten turns so as to suspend between external electrodes. Using an impedance analyzer (manufactured by Agilent Technologies, Inc., model 4294A) and an ultra-high resistance meter (manufactured by ADVANTEST CORPORATION, model R8340A), electric fields of 60 V/mm and 140 V/mm were applied to external electrodes, and an inductance L of the coil was measured to determine an inductance change rate ΔL from the mathematical formula (9). The inductance L was measured without applying a magnetic field.

$$\Delta L = (L_1 - L_0)/L_0 \} \times 100 \quad (9)$$

In the formula, $L_0$ is an inductance (H) when no voltage is applied, and $L_1$ is an inductance (H) when a voltage is applied.

Figure 17:
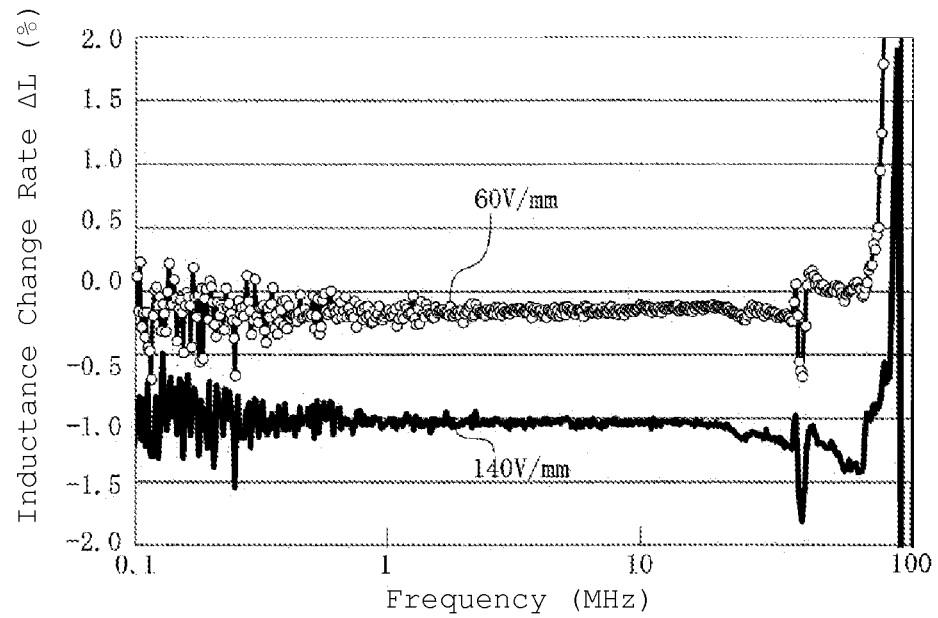
FIG. 17 is a chart showing an example of a frequency characteristic of an inductance change rate of the ceramic electronic component.

FIG. 17 shows a frequency characteristic of an inductance change rate ΔL at the time of applying electric fields of 60 V/mm and 140 V/mm. The horizontal axis of FIG. 17 indicates the frequency (Hz) and the vertical axis indicates the inductance change rate ΔL.

As is apparent from FIG. 17, it was found that the inductance L is changed by applying an electric field to the component base body formed of the oxide ceramic of the present invention, and the inductance change rate ΔL can be controlled by varying the magnitude of the electric field.

In addition, in the present example, since the electric field was applied in homopolarity with the direction of electric field application at the time of polarization processing, the inductance changed to the negative side; however, it was also found that when the electric field is applied in reverse polarity with the direction of electric field application at the time of polarization processing, the inductance changes to the positive side.

It is known that when the electric field is applied, the magnetic permeability can be modulated by heat generation, and it was also confirmed that the magnetic permeability increases in the present oxide ceramic. That is, in the case of heat generation, the inductance increases, and the change of inductance to the negative side shown in the present example shows that the change is achieved by applying the electric field to the component base body exhibiting the electromagnetic effect to vary the magnetic permeability.

Next, the electric field to be applied was set to 140 V/mm, and the change in inductance L at the time of repeating application and non-application was examined by use of the impedance analyzer.

Figure 18:
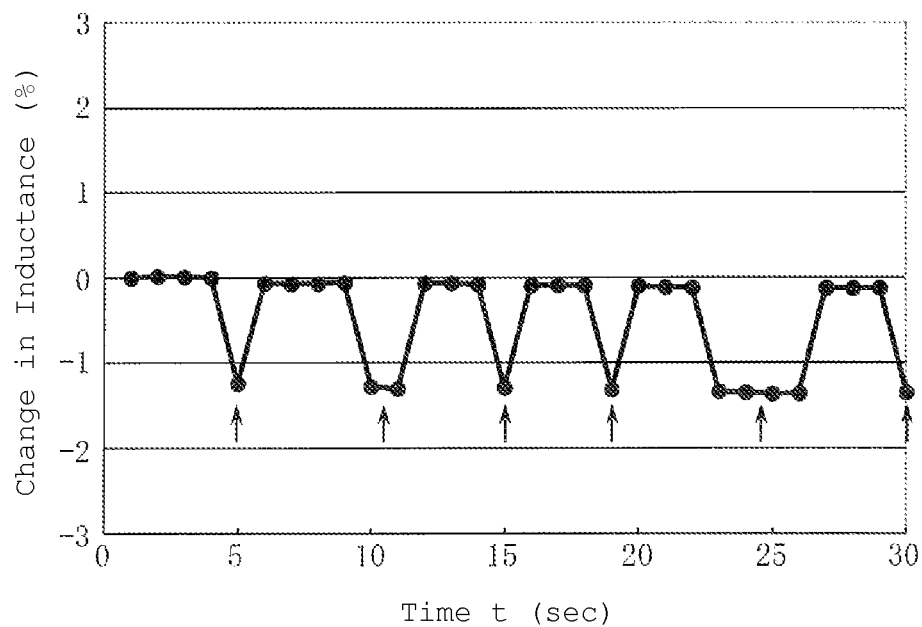
FIG. 18 is a chart showing an example of a change in inductance at the time of repeating voltage application-voltage non-application in the ceramic electronic component.

FIG. 18 shows a change in inductance at the time of applying an electric field with reference to the case where no electric field is applied. The horizontal axis of FIG. 18 indicates a time t (sec) and the vertical axis indicates a change in inductance (%). Measurement was carried out at 1 second intervals, and in FIG. 18, arrows indicate electric field application.

As is apparent from FIG. 18, when an electric field is applied, the inductance L is lowered, but the inductance returns to a nearly original value when the application of the electric field is stopped, and therefore it was verified that the oxide ceramic has good voltage responsiveness.

(Power Generation Characteristic)

The sample of sample No. 41 was placed in a magnetic field, the magnetic field was varied at a speed of 8 sec/one reciprocation in a magnetic field range of 0.005 to 0.11 T, and the electromagnetic current discharged from the sample was measured.

Figure 19:
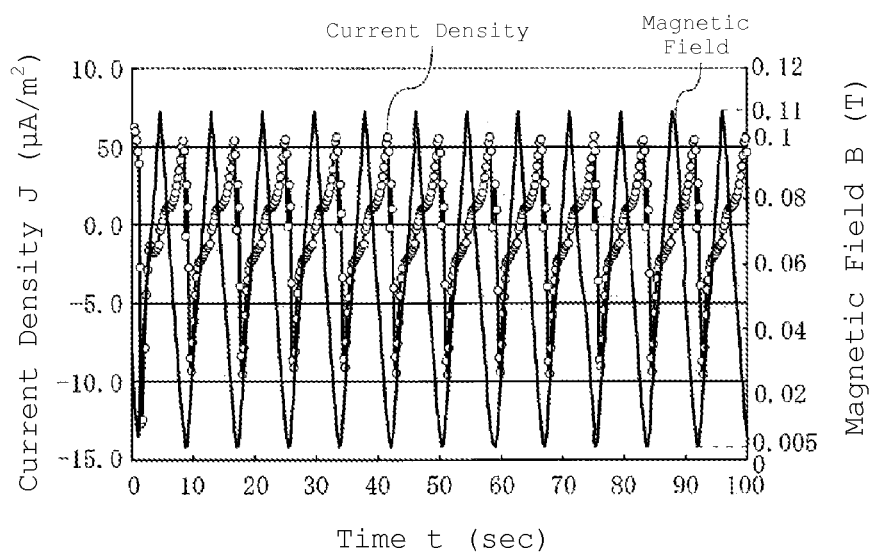
FIG. 19 is a chart showing an example of a power generation characteristic of the ceramic electronic component.

FIG. 19 shows the results of measurement.

The horizontal axis of FIG. 19 indicates a time t (sec), the right vertical axis indicates a magnetic field B (T), and the left vertical axis indicates a current density J ($\mu A/m^2$) of the electromagnetic current.

As is apparent from FIG. 19, when the magnetic field was varied, a current was output stably from the sample, and therefore it was found that a good power generation characteristic is attained.

It becomes possible to realize an oxide ceramic capable of stably attaining better insulation performance and better ferromagnetic dielectric properties, and a ceramic electronic component, such as inductors or power generation elements, using the oxide ceramic.

DESCRIPTION OF REFERENCE SYMBOLS 1, 5, 11 Component base body
2a, 2b, 6a, 6b, 12a, 12b External electrode
3a to 3c, 8a to 8h, 13a to 13h Internal electrode
9a, 9b, 10a, 10b, 17a, 17b, 18a, 18b Permanent magnet
14 a planar coil
15 Internal conductor

The invention claimed is:

1. An oxide ceramic comprising:
a principal component represented by a general formula $Sr_{3-x}A_xCo_{2-y}M_yFe_{24-z}O_{41}$; and
zirconium in an amount of 0.05 to 1.0 wt. % on an oxide equivalent basis, wherein
A is one of Ba and Ca, and M represents at least one element selected from among Ni, Zn and Mg,
x satisfies $0 \le x \le 0.5$ when the element A is Ba and satisfies $0 \le x \le 0.2$ when the element A is Ca, and
y and z satisfy $0 \le y \le 0.3$ and $0 \le z \le 0.5$, respectively.

2. A ceramic electronic component comprising:
a component base body comprising the oxide ceramic according to claim 1;
external electrodes on a surface of the component base body; and
a coil disposed so as to have an inductance in accordance with a magnetic permeability of the component base body.

3. The ceramic electronic component according to claim 2, wherein the component base body includes an electrode for applying a voltage.

4. The ceramic electronic component according to claim 3, wherein
the electrode for applying a voltage includes at least one internal electrode, and
the internal electrode is electrically connected to at least one of the external electrodes on the surface of the component base body.

5. The ceramic electronic component according to claim 2, wherein the coil is wound around the component base body so as to be suspended between the external electrodes.

6. The ceramic electronic component according to claim 2, wherein the coil is wound around a perimeter of the component base body excluding the external electrodes.

7. The ceramic electronic component according to claim 2, wherein the coil is embedded in the component base body.

8. The ceramic electronic component according to claim 2, wherein the coil has a planar coil conductor and is adjacent at least one principal surface of the component base body.

9. The ceramic electronic component according to claim 8, further comprising an insulating layer interposed between the coil and the component base body.

10. The ceramic electronic component according to claim 2, further comprising a magnet disposed in a vicinity of at least one of the external electrodes.

11. The ceramic electronic component according to claim 2, further comprising a magnet disposed in a vicinity of at least one principal surface of the component base body.

12. The ceramic electronic component according to claim 2, wherein the ceramic electronic component is a variable inductor.

13. The ceramic electronic component according to claim 2, wherein the ceramic electronic component is a power generation element.

14. The ceramic electronic component according to claim 2, wherein the ceramic electronic component is a magnetic sensor.

15. The ceramic electronic component according to claim 2, wherein the ceramic electronic component is a current sensor.

16. An oxide ceramic comprising:
   $Sr_3Co_2Fe_{24}O_{41}$ having a hexagonal Z-type crystal structure; and
   $ZrO_2$ in an amount of 0.05 to 1.0 wt. % on an oxide equivalent basis.

17. A ceramic electronic component comprising:
   a component base body comprising the oxide ceramic according to claim 16;
   external electrodes on a surface of the component base body; and
   a coil disposed so as to have an inductance in accordance with a magnetic permeability of the component base body.

18. The ceramic electronic component according to claim 17, wherein the component base body includes an electrode for applying a voltage.

19. The ceramic electronic component according to claim 18, wherein
   the electrode for applying a voltage includes at least one internal electrode, and
   the internal electrode is electrically connected to at least one of the external electrodes on the surface of the component base body.

20. The ceramic electronic component according to claim 17, wherein the coil is wound around the component base body so as to be suspended between the external electrodes.

21. The ceramic electronic component according to claim 17, wherein the coil is wound around a perimeter of the component base body excluding the external electrodes.

22. The ceramic electronic component according to claim 17, wherein the coil is embedded in the component base body.

23. The ceramic electronic component according to claim 17, wherein the coil has a planar coil conductor and is adjacent at least one principal surface of the component base body.

24. The ceramic electronic component according to claim 23, further comprising an insulating layer interposed between the coil and the component base body.

25. The ceramic electronic component according to claim 17, further comprising a magnet disposed in a vicinity of at least one of the external electrodes.

26. The ceramic electronic component according to claim 17, further comprising a magnet disposed in a vicinity of at least one principal surface of the component base body.

27. The ceramic electronic component according to claim 17, wherein the ceramic electronic component is a variable inductor.

28. The ceramic electronic component according to claim 17, wherein the ceramic electronic component is a power generation element.

29. The ceramic electronic component according to claim 17, wherein the ceramic electronic component is a magnetic sensor.

30. The ceramic electronic component according to claim 17, wherein the ceramic electronic component is a current sensor.

* * * * *